US006961011B2

(12) United States Patent
Matthews

(10) Patent No.: US 6,961,011 B2
(45) Date of Patent: Nov. 1, 2005

(54) DATA COMPRESSION SYSTEM

(75) Inventor: Phillip M. Matthews, Cary, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 941 days.

(21) Appl. No.: 09/941,101

(22) Filed: Aug. 27, 2001

(65) Prior Publication Data

US 2003/0083049 A1 May 1, 2003

(51) Int. Cl.[7] .................................................. H03M 7/00
(52) U.S. Cl. ............................. 341/87; 341/50; 341/51; 382/232
(58) Field of Search ............................. 341/87, 50, 51, 341/67, 63; 375/240; 711/202; 382/232; 708/203; 704/503

(56) References Cited

U.S. PATENT DOCUMENTS

| | | | | | |
|---|---|---|---|---|---|
| 5,058,144 | A | * | 10/1991 | Fiala et al. | 375/240 |
| 5,373,290 | A | * | 12/1994 | Lempel et al. | 341/51 |
| 5,384,568 | A | * | 1/1995 | Grinberg et al. | 341/51 |
| 5,410,671 | A | * | 4/1995 | Elgamal et al. | 711/202 |
| 5,455,576 | A | * | 10/1995 | Clark et al. | 341/50 |
| 5,463,390 | A | * | 10/1995 | Whiting et al. | 341/51 |
| 5,485,526 | A | * | 1/1996 | Tobin | 382/232 |
| 5,488,366 | A | * | 1/1996 | Wu | 341/67 |
| 5,533,051 | A | * | 7/1996 | James | 375/240 |
| 5,627,533 | A | * | 5/1997 | Clark | 341/51 |
| 5,663,721 | A | | 9/1997 | Rossi | 341/51 |
| 5,686,912 | A | * | 11/1997 | Clark et al. | 341/51 |
| 5,689,255 | A | * | 11/1997 | Frazier et al. | 341/63 |
| 5,701,468 | A | | 12/1997 | Benayoun et al. | 395/612 |
| 5,774,467 | A | | 6/1998 | Herrera Van Der Nood et al. | 370/428 |
| 5,945,933 | A | * | 8/1999 | Kalkstein | 341/63 |
| 5,951,623 | A | * | 9/1999 | Reynar et al. | 708/203 |
| 6,320,522 | B1 | * | 11/2001 | Satoh | 341/51 |
| 6,377,930 | B1 | * | 4/2002 | Chen et al. | 704/503 |
| 6,378,007 | B1 | * | 4/2002 | Southwell | 710/1 |
| 6,597,812 | B1 | * | 7/2003 | Fallon et al. | 382/232 |

OTHER PUBLICATIONS

Appleton, Brad, "An Introduction to AVL Trees and Their Implementation," *Enteract* On–line: http://www.enteract.com/~bradap, pp. 1–22, 1989–1997, no month.

The International Telegraph and Telephone Consultative Committee, "Data Compression Procedures for Data Circuit Terminating Equipment (DCE) Using Error Correction Procedures, Recommendation V.42 bis," pp. 1–27, 1990, no month.

Nelson, Mark, "LZW Data Compression," *Dr. Dobb's Journal* On–line. http://www.dogma.net/markn/articles/lzw, pp. 1–14, Oct., 1989.

Pfaff, Ben, "libavl–A Library for Manipulation of AVL Trees." On–line, http://www.delorie.com/gnu/docs/avl, pp. 1–19, Oct., 1999.

* cited by examiner

*Primary Examiner*—Jean Bruner Jeanglaude
(74) *Attorney, Agent, or Firm*—Foley & Lardner, LLP

(57) ABSTRACT

A data compression scheme implemented based on V.42bis implemented in hardware within mobile units of a cellular system is disclosed. The data compression scheme includes a number of hardware state machines that perform data compression and decompression functions. Additionally, a dictionary of codewords and character strings is organized according to keys and is implemented as a balanced binary tree.

56 Claims, 18 Drawing Sheets

DATA COMPRESSION SYSTEM

TECHNICAL FIELD

The present invention is directed to communication systems and, more particularly, to data compression systems for efficiently transferring data.

BACKGROUND ART

Data compression systems seek to minimize an amount of information that needs to be stored or sent to convey a particular message. Data compression may be thought of as transferring a shorthand message to convey a long hand meaning. For example, if a sender and a receiver have agreed to the word "Hello" by sending the number 5, as represented by eight bits, rather than sending five seven-bit ASCII (American Standard Code for Information Interchange) characters representative of the text, "Hello," the receiver knows that if it receives a 5, that 5 corresponds to the text "Hello." Such a system is a data compression system because eight bits representative of the number 5 may be transferred rather than the 35 bits associated with the ACSII text for "Hello." Various data compression schemes are known and are implemented in various systems such as, for example, data storage and data transfer.

One application in which data compression algorithms may be used is in digital communication systems. Digital communication systems typically include a mobile unit, which may be embodied in a digital cellular telephone or any other portable communication device, and an infrastructure unit, which may be embodied in a cellular base station or any other suitable communication hardware. During operation, the mobile unit and the infrastructure unit exchange digital information using one of a number of communication protocols. For example, the mobile and infrastructure units may exchange information according to a time division multiple access (TDMA) protocol, a code division multiple access (CDMA) protocol or a global system for mobile communications (GSM) protocol. The details of the TDMA protocol are disclosed in the IS-136 communication standard, which is available from the Telecommunication Industry Association (TIA). The GSM protocol is widely used in European countries and within the United States. The details of the GSM protocol are available from the European Telecommunications Standards Institute. The details of the second generation CDMA protocol are disclosed in the IS-95 communication standard. Third generation CDMA standards are typically referred to as Wideband CDMA (WCDMA). The most prevalent WCDMA standards that are currently being developed are the IS-2000 standard, which is an evolution of the IS-95 protocol, and the uniform mobile telecommunication system (UMTS) protocol, which is an evolution of the GSM protocol.

In addition to the conventional voice handling capabilities of digital communication systems, the integration of display screens into mobile units enable such units to receive graphical and text-based information. Additionally, as various other electronic devices such as, for example, personal digital assistants (PDAs) are used as wireless communication devices, such devices need to display graphical and text-based information. As mobile communication devices such as cellular telephones and PDAs receive text-based information, there is a need to compress and decompress information in an efficient manner so that mobile communication devices can provide textual information to users in a manner that is efficient from both a bandwidth perspective and a processing perspective.

One compression algorithm that is widely known and used is the Ziv and Lempel algorithm, which converts input strings of symbols or characters into fixed length codes. As strings are converted into the fixed length codes, the algorithm stores, in a dictionary, a list of strings and a list of fixed length codes to which the strings correspond. Accordingly, as the algorithm encounters strings that have already been encountered, the algorithm merely reads and transmits the fixed length code corresponding to that particular previously-encountered string. As will be readily appreciated, and as with most any compression technique, both the data transmitter and the data receiver must maintain identical codeword dictionaries containing codewords and the strings to which the codewords correspond.

Data compression for telecommunication applications is the focus of CCITT (The International Telegraph and Telephone Consultative Committee) Recommendation V.42bis, which is entitled "Data Compression Procedures for Data Circuit Terminating Equipment (DCE) Using Error Correction Procedures" and is available from the International Telecommunication Union (ITU) (1990). The Recommendation V.42bis is hereby incorporated herein by reference. While the Recommendation V.42bis provides guidelines for data compression, the Recommendation does not provide specific details regarding the implementation of a system that is compliant with V.42bis.

As will be readily appreciated by those having ordinary skill in the art, processing speed and power are of great interest to those who implement a V.42bis based compression system. To that end, U.S. Pat. No. 5,701,468 to Benayoun et al. discloses a technique for organizing a codeword dictionary having four data fields. Benayoun et al. indicates that the proffered codeword dictionary structure facilitates the easy manipulation of codewords and strings and makes accesses to memory storing the dictionary faster. Benayoun et al. discloses that an instruction state machine reads software instructions from an external memory and executes such software instructions to coordinate the operation of various portions of hardware.

SUMMARY OF THE PREFERRED EMBODIMENTS

According to one aspect, the present invention may be embodied in an encoding system adapted to encode data strings into codewords. The encoding system may include a first memory portion adapted to store a dictionary of data strings and codewords corresponding to the data strings, wherein the dictionary is implemented as a balanced binary tree and a second memory portion adapted to store a data string to be processed. The system may also include an encoder adapted to receive from the second memory portion the data string to be processed, to determine if a codeword corresponding to a portion of the data string to be processed is stored in the dictionary and to output a codeword corresponding to a data string previously found in the dictionary if the codeword corresponding to the portion of the data string to be processed is not stored in the dictionary, wherein the encoder is further adapted to balance the dictionary.

According to a second embodiment, the present invention may be a decoding system adapted to decode codewords into data strings. The decoding system may include a memory adapted to store a dictionary of data strings and codewords corresponding to the data strings, wherein the dictionary is implemented as a balanced binary tree and an input buffer adapted to receive and store a set of codewords to be processed. Further, the system may include a decoder adapted to receive from the input buffer the set of codewords to be processed, to decode a first codeword into a first character string, to decode a second codeword into a second character string and to assign a third codeword to a combination of the first codeword and the second character string if a codeword corresponding to the combination of the first codeword and the second character string is not stored in the dictionary, wherein the decoder is further adapted to balance the dictionary.

According to a third aspect, the present invention may be embodied in an encoder adapted to operate with a first memory portion adapted to store a dictionary of data strings and codewords corresponding to the data strings, wherein the dictionary is implemented as a balanced binary tree, and a second memory portion adapted to receive and store a data string to be processed. In such an arrangement, the encoder may include a first hardware state machine adapted to receive from the second memory portion the data string to be processed and a second hardware state machine adapted to determine if a codeword corresponding to a portion of the data string to be processed is stored in the dictionary and to output a codeword corresponding to a data string previously found in the dictionary if the codeword corresponding to the portion of the data string to be processed is not stored in the dictionary. The encoder may also include a third hardware state machine adapted to balance the dictionary.

According to a fourth embodiment, the present invention may be embodied in a decoder adapted to operate with a memory adapted to store a dictionary of data strings and codewords corresponding to the data strings. The dictionary is implemented as a balanced binary tree, and an input buffer adapted to receive and store a set of codewords to be processed. In such an arrangement, the decoder may include a first hardware state machine adapted to receive from the input buffer the set of codewords to be processed and a second hardware state machine adapted to decode a first codeword into a first character string, to decode a second codeword into a second character string and to assign a third codeword to a combination of the first codeword and the second character string if a codeword corresponding to the combination of the first codeword and the second character string is not stored in the dictionary. The decoder may also include a third hardware state machine adapted to balance the dictionary.

These and other features of the present invention will be apparent to those of ordinary skill in the art in view of the description of the preferred embodiments, which is made with reference to the drawings, a brief description of which is provided below.

DESCRIPTION OF THE PREFERRED EMBODIMENTS

As described hereinafter, a data compression scheme implemented based on V.42bis may be implemented in hardware within mobile units. As opposed to a software implementation, the hardware implementation eliminates the need to retrieve instructions from memory and to execute the retrieved instructions. Rather, the hardware implementation operates using a number of hardware state machines that do not require the retrieval and execution of software instructions from memory. Accordingly, because a hardware implementation eliminates the need to retrieve instructions, a hardware implementation typically requires fewer clock cycles than a software implementation requests to achieve the same result.

Additionally, as described in detail hereinafter, the data compression hardware in the mobile unit uses an Adelson-Velskii and Landis (AVL) algorithm for storing codewords and their corresponding strings in a data dictionary that is a balanced binary tree. A balanced binary tree is most efficient directory structure to search because each search decision eliminates half of the remaining unsearched dictionary.

Because the mobile unit implements data compression in hardware and uses the AVL algorithm to create AVL trees, the data compression techniques used in the mobile unit allow for rapid codeword dictionary searching, codeword addition and codeword deletion to accommodate data rates up to 384 kilobits per second (kbps). The codeword dictionary, which is implemented as an AVL tree that is balanced binary tree, may be searched in $O(\log_2 n)$ time, wherein n is the size of the dictionary. The speed of searching an AVL tree is due to the fact that an AVL tree is balanced at that each binary search operation eliminates half of the unsearched AVL tree entries.

Figure 1:
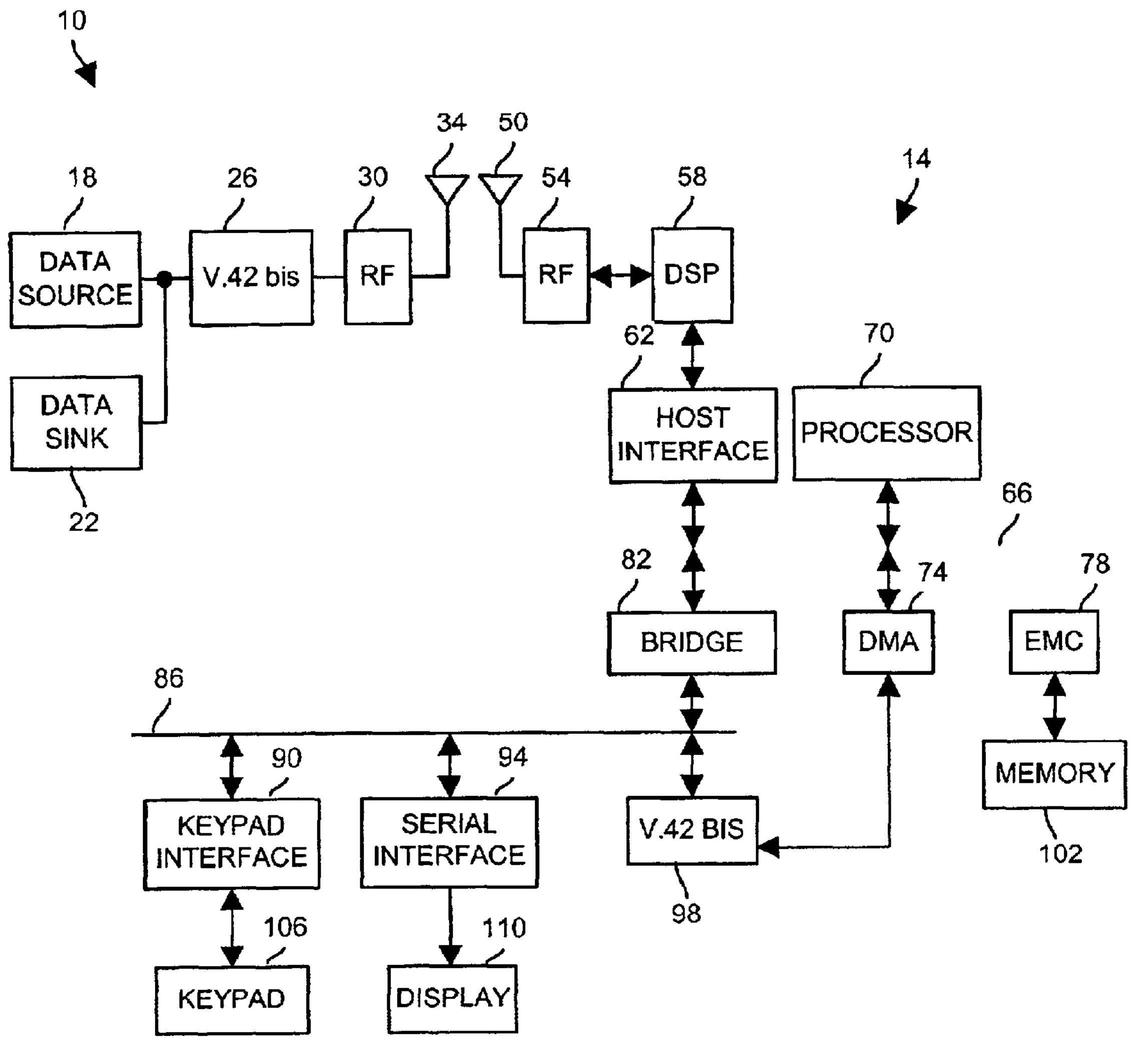
FIG. 1 is an exemplary block diagram of a communication system that may employ a data compression system.

As shown in FIG. 1, a data communication system generally includes a first and second data transceivers 10 and 14, respectively. For example, the first data transceiver 10 may be embodied in a cellular infrastructure base station having a data source 18 and a data sink 22, each of which is connected to a V.42bis module 26. The V.42bis module 26 is further connected to a radio frequency (RF) module, which, in turn, is coupled to an antenna 34. In general, the V.42bis module 26 translates between codewords and characters.

For example, in data transmission operation, the data source 18 couples characters for transmission to the second data transceiver 14 to the V.42bis module 26, which compresses the characters into codewords that are coupled to the RF module 30 and broadcast as RF energy from the antenna 34. Conversely, during data reception operation, the antenna 34 receives RF energy that the RF module 30 converts into data signals representative of codewords that are coupled to the V.42bis module 26. In the receive path, the V.42bis module 26 converts the codewords from the RF module 30 into characters that are coupled to the data sink 22. In the example provided, the data source 18 and the data sink 22 are representative of any suitable data processing or storage hardware and/or software.

The second data transceiver 14 may be embodied in the hardware of a mobile unit such as a cellular telephone or a PDA. Because most of the following description contained herein pertains to the second data transceiver 14, sufficiently more detail is provided with respect to the second data transceiver 14 than was provided with respect to the first data transceiver 10. The second data transceiver 14 includes an antenna 50 coupled to an RF module 54, which, in turn, is coupled to a digital signal processor (DSP) 58. The DSP 58 is coupled to a host interface 62, which communicatively couples the DSP 58 to a processor data bus 66.

As shown in FIG. 1, numerous components are coupled to the processor data bus 66. Such components include a processor 70, a direct memory access (DMA) module 74, an external memory controller 78 and a bridge 82. The bridge 82 communicatively couples the processor data bus 66 and, therefore, each of the components coupled thereto to a peripheral data bus 86.

A keypad interface 90, a serial interface 94 and a V.42bis module 98, of which further details are provided below, are each coupled to the peripheral data bus 86. The V.42bis module 98 is further coupled to both the processor data bus 66 and the DMA module 74.

Each of the components 58–98 may be embodied in integrated hardware that is fabricated from semiconductor material. Interfaced to the EMC 78, the keypad interface and the serial interface 94 are a memory 102, a keypad 106 and a display 110, respectively. Each of the memory 102, the keypad 106 and the display 110 are external to the integrated hardware embodying components 58–98.

As with the first data transceiver 10, the second data transceiver 14 is adapted both to send and to receive information. In general, in the receive path, the second data transceiver 14 receives signals representative of codewords and processes those codewords to obtain the characters the codewords represent by looking the received codewords up in a data dictionary, which, as described in further detail below, is contained in the V.42bis module 98. The characters may then be displayed to the user via the display 110, which may be embodied in a liquid crystal display (LCD), a light emitting diode (LED) display or any other suitable display technology.

Alternatively, in the receive path, the second data transceiver 14 may receive characters for which codewords are not yet selected and may display such characters to the user. Additionally, when characters are received, the V.42bis module 98 may assign codewords to those characters so that, in the future, relatively short codewords, as opposed to the relatively long characters, may be exchanged between the first and second data transceivers 10, 14.

In the transmit path, previously used characters or strings of characters from the memory 102 or the keypad 106 are processed into codewords by the V.42bis module 98 and the codewords may be transmitted from the second data transceiver 14 to the first data transceiver 10. If, however, the characters or string of characters has not been previously transmitted, the V.42bis module 98 may assign a codeword thereto so that the codeword may be used to represent the string of characters. Further detail regarding the operation of the V.42bis module 98 is provided hereinafter in conjunction with FIGS. 3–20.

Figure 2:
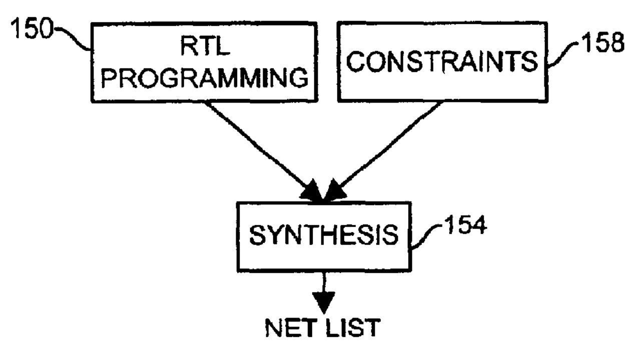
FIG. 2 is an exemplary block diagram representing the process by which programming and constraints may be processed to produce a hardware netlist.

As noted with respect to FIG. 1, certain components of the second data transceiver 14 may be integrated into hardware. FIG. 2 illustrates the process by which such an integration may be performed. For example, as shown at the block 150, code written in a software language, such as a register-transfer-level (RTL) synthesis language like Verilog, is provided to a well known synthesis module 154. Verilog, for example, is a hardware description language used to design and document electronic systems, which allows designers to design at various levels of abstraction. The code represents the functionality that is desired for a particular portion of hardware that will be designed by the synthesis module 154. The code may be written in programming structures such as routines and subroutines that may be used to create hardware state machines that operate without the need to read instructions from a memory. As further shown in FIG. 2, constraints 158, such as clocks and I/O timing, are provided to the synthesis module 154.

The synthesis module 154 processes the RTL programming or code 150 and the constraints 158 to produce a netlist. The netlist specifies all of the hardware blocks and interconnections that must be fabricated in semiconductor material to carry out the functionality written in the RTL programming. The netlist may be sent to a semiconductor foundry, which will process the netlist into a semiconductor hardware device.

Having generally described the first and second data transceivers 10, 14 and the process by which hardware components are specified and fabricated, the details of the V.42bis module 98 will now be described. In particular, the various hardware blocks and state machines that comprise the V.42bis module will be described, it being understood that such hardware blocks and state machines could be produced as described in conjunction with FIG. 2 or in any other suitable manner.

Table 1 below includes a number of definitions that are used hereinafter in conjunction with the description of the data compression system.

TABLE 1

| | |
|---|---|
| Character Single | Data element encoded using a predefined number of bits ($N_3$ = 8). |
| Ordinal Value | Numerical equivalent of the binary encoding of the character. For example, the character "A", when encoded as 01000001, would have an ordinal value of $65_{10}$. |

TABLE 1-continued

| | |
|---|---|
| Alphabet | Set of all possible characters that may be sent or received across the interface. It is assumed that the ordinal values of the alphabet are contiguous from 0 to $N_4 - 1$, where $N_4$ is the number of characters. |
| Codeword | The binary number in the range 0 to $N_2 - 1$ that represents a string of characters in compressed form. A codeword is encoded using a number of bits $C_2$, where $C_2$ is initially 9 ($N_3 + 1$) and increases to a maximum of $N_1$ bits. |
| Control Codeword | Reserved for use in signaling of control information related to the compression function while in the compressed mode of operation. |
| Command Code | Octet which is used for signaling of control information related to the compression function while in the transparent mode of operation. Command codes are distinguished from normal characters by a preceeding escape character. |
| Tree Structure | Abstract data structure to represent a set of strings with the same initial character. |
| Leaf Node | Point on a tree that represents the last character in a string. |
| Root Node | Point on a tree that represents the first character in a string. |
| Compressed | Compressed operation has two modes as defined below. |
| Operation | Transitions between these modes may be automatic based on the content of the data received. |
| Compressed Mode | A mode of operation in which data is transmitted in codewords. |
| Transparent Mode | A mode of operation in which compression has been selected but data is being transmitted in uncompressed form. Transparent mode command code sequences may be inserted into the data stream. |
| Uncompressed Operation | A mode of operation in which compression has not been selected. The data compression function is inactive. |
| Escape Character | Character that during transparent mode indicates the beginning of a command code sequence. This has an initial value of zero, and is adjusted on each appearance of the escape character in the data stream, whether in transparent or compressed mode. |

Table 2 is a list of parameters that are used hereinafter in description of the compression system.

TABLE 2

| | |
|---|---|
| $N_1$ | Maximum codeword size (bits) |
| $N_2$ | Total number of codewords |
| $N_3$ | Character size (bits). $N_3 = 8$. |
| $N_4$ | Number of characters in the alphabet. $N_4 = 2N_3$. |
| $N_5$ | Index number of first dictionary entry used to store a string. $N_5 = N_4 + N_6$. |
| $N_6$ | Number of control codewords. $N_6 = 3$. |
| $N_7$ | Maximum string length. |
| $C_1$ | Next empty dictionary entry. |
| $C_2$ | Current codeword size. |
| $C_3$ | Threshold for codeword size change. |
| $P_0$ | V.42bis data compression request. |
| $P_1$ | Number of codewords (negotiation parameter). |
| $P_2$ | Maximum string size (negotiation parameter). |

Figure 3:
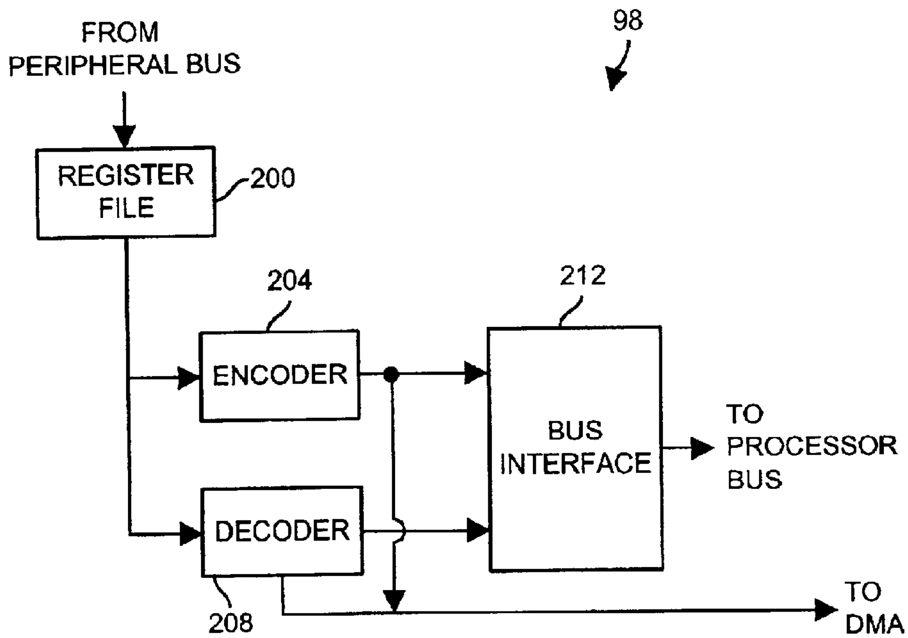
FIG. 3 is an exemplary block diagram of the V.42bis module of FIG. 1.

The V.42bis module 98, as shown in FIG. 3, includes a register file 200 or buffer that is coupled to the peripheral bus 86. The register file 200 is coupled to an encoder 204 and to a decoder 208. The details of the encoder 204 and the decoder 208 are described in conjunction with FIGS. 4–20. The V.42bis module 98 further includes a bus interface 212 that couples the encoder 204 and the decoder 208 to the processor bus 66. The encoder 204 and the decoder 208 are further coupled to the DMA 74.

During operation of the V.42bis module 98, the encoder 204 receives character strings and produces codewords corresponding to the character strings and the decoder 208 receives codewords and produces the character strings corresponding to the codewords. The character strings and codewords may be coupled to the processor bus 66 via the bus interface 212. Alternatively, the encoder 204 and the decoder 208 may receive characters or codewords from the DMA 74.

Figure 4:
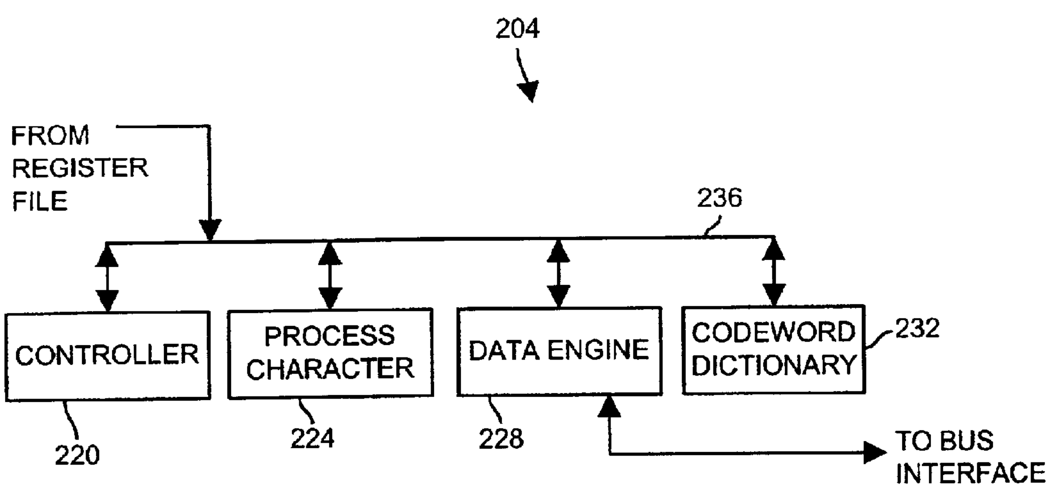
FIG. 4 is an exemplary block diagram representing a state machine of the encoder of FIG. 3.

Referring now to FIG. 4, the encoder 204 includes a controller module 220, a process character module 224, a data engine module 228 and a codeword dictionary module 232, all of which may be interconnected by a bus 236. In operation, the encoder 204 compresses character data into codewords and exchanges data, either character data or codewords, with the processor 70 or the DMA 74. The main functions of the encoder 204, as described in detail hereinafter, include communications with an encoder dictionary that may be implemented in the memory 102 to, for example, look up strings, to update the encoder dictionary and to remove nodes from the encoder dictionary. The encoder 204 supports both transparent and compressed modes of operation and also performs compressibility tests to switch between the compressed and transparent modes of operation. Further, the encoder 204 supports peer-to-peer communication.

Each of the modules of the encoder modules 220-module 232 is described in detail hereinafter with respect to FIGS. 5–8 and 14–20. In particular, FIGS. 5–8 and 14–20 represent a number of state machines having various states through which the state machines cycle. As will be readily appreciated by those having ordinary skill in the art, such state machines may be implemented in hardware using gates such as flip-flops, or any other suitable hardware components. The following description of state machines adopts the nomenclature of all capital letters when referring to states and lower case letters when referring to transitions between states. Additionally, the following description refers to various register, signals or variable names, which are shown in italic typeface.

Figure 5:
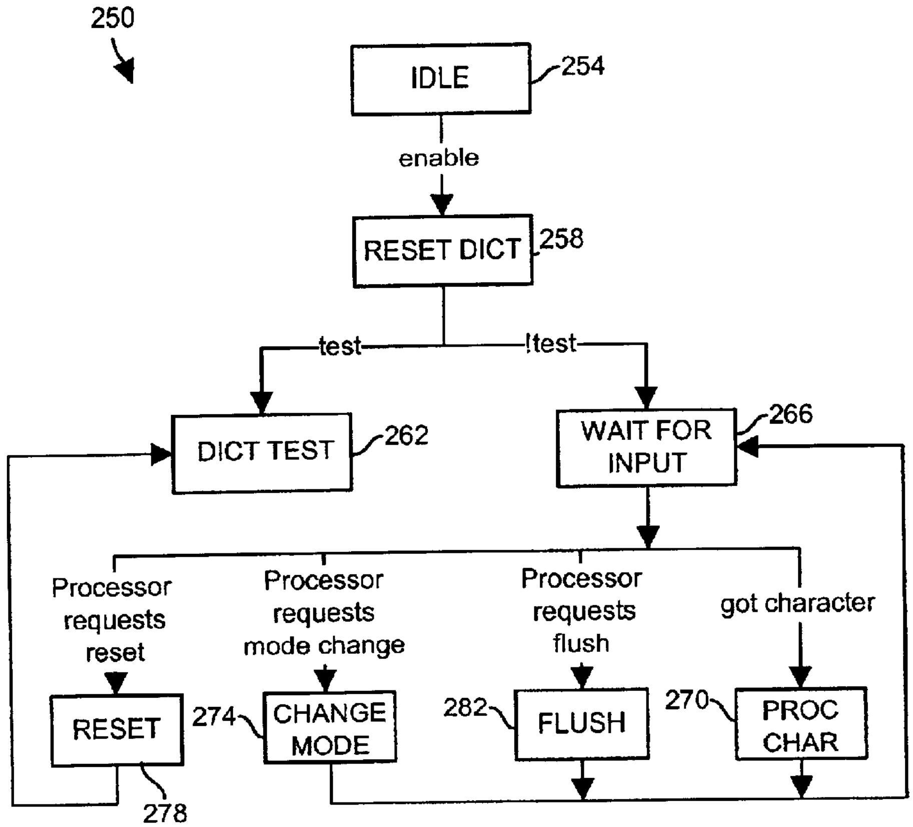
FIG. 5 is an exemplary diagram representing a state machine of the encoder controller module of FIG. 4.

The controller module 220 controls the overall functionality of the encoder 204 and may be represented by a state machine 250, which is shown in FIG. 5. The state machine 250 begins operation in an IDLE state 254. Once the encoder 204 is enabled, the state machine 250 transitions from the IDLE state 254 to a RESET_DICT state 258, where the state machine 250 asserts a reset_dictionary output to the codeword dictionary module 232, which initializes the codeword dictionary module 232. Initialization consists of ensuring that each tree includes only root nodes (the alphabet plus the control codewords), ensuring that the codeword associated with each root shall be $N_6$ plus the ordinal value of the character and ensuring that the counter, $C_1$, used in the allocation of new nodes, shall be set to $N_5$.

If the encoder 204 is in test mode, the state machine 250 transitions from the RESET_DICT state 258 to a DICT_TEST state 262 after initialization. The test mode is used for verification of the AVL algorithm and provides a direct register interface to the codeword dictionary module 232. While in the DICT_TEST state 262, three dictionary functions (search, insert and delete) are accessible through a test register.

If, however, the encoder 204 is not in test mode, control passes from the RESET_DICT state 258 to a WAIT_FOR_INPUT state 266, in which the state machine 250 waits for a character input from one of several sources, such as, for example, a new character, change mode request, flush request or a reset request. If the data engine 228 indicates that a new character is received, the state machine transitions 250 to a PROC_CHAR state 270, at which the process character module 224 is enabled. In the PROC_CHAR state 270, the controller 220 asserts a proc_char output to the process character module 224. Once the process character module 224 completes its execution, it asserts a proc_char_done output, which causes the state machine 250 to transition back to the WAIT_FOR_INPUT state 266.

If the processor 70 requests a mode change, the state machine 250 transitions from the WAIT_FOR_INPUT state 266 to a CHANGE_MODE state 274. In the CHANGE_MODE state 274, the state machine 250 asserts a change_mode output to the data engine module 228. Once the data engine module 228 has sent the appropriate characters/codewords to change modes, it asserts change_mode_done output, which causes the state machine 250 to transition back to the WAIT_FOR_INPUT state 266.

If the processor 70 requests reset of the codeword dictionary module 232, the state machine 250 transitions to the RESET_DICT state 278. Alternatively, if the processor 70 requests a flush, the state machine transitions 250 to a FLUSH state 282. In the FLUSH state 282, the state machine 250 asserts a flush output to the data engine module 228. The data engine module 228 sends any queued bits and asserts flush_done, at which point the state machine 250 transitions to the WAIT_FOR_INPUT state 266.

The controller 220 maintains the mode of the encoder 204 in a mode register, which is initialized to zero to indicate that the encoder 204 is in transparent mode. When the state machine 250 is in the CHANGE_MODE state 274 and the change_mode_done signal is asserted, the mode register toggles, thereby switching the mode of the encoder 204. If the state machine 250 is in the RESET_DICT state 278, the mode register is reset to zero, thereby placing the encoder in transparent mode.

The controller 220 also includes a storage element named string_empty to indicate if the current string is empty. When set, string_empty indicates there are is no accumulated string of characters and the next character is the beginning of a new string. When zero, string_empty indicates that there exists a string and that the next character should be appended to that string. String_empty is initialized to one on system reset and it is cleared when the state machine 250 transitions from the WAIT_FOR_INPUT state 266 to the PROC_CHAR state 270. String_empty is set when the state machine 250 transitions from either the FLUSH state 282 or CHANGE_MODE state 274.

Another register, named exception, informs the process character module 224 when an exception occurs. The exception register is initialized to zero on system reset and it is set when the state machine 250 transitions from either the CHANGE_MODE state 274 or the FLUSH state 282. The exception register is cleared on a transition from the PROC_CHAR state 270.

Figure 6:
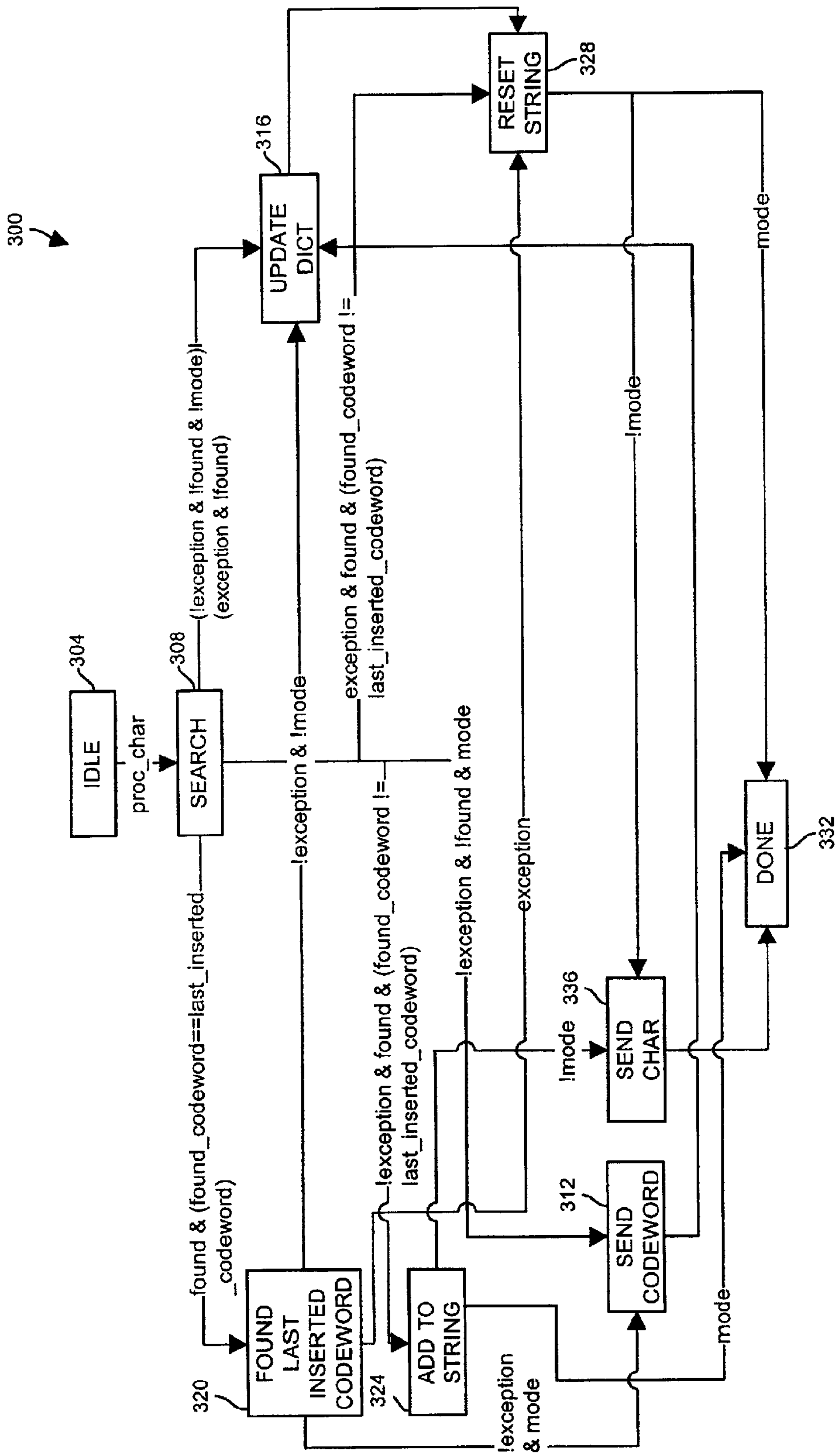
FIG. 6 is an exemplary diagram representing a state machine of the process character module of FIG. 4.

The process character module 244, as represented by a state machine 300 shown in FIG. 6 receives a new character from the data engine 228 and implements the decision making logic needed to process the character. The process character module 244 maintains string_code and char storage elements, which are used to store the current string and new character, respectively. An 11-bit register, last_inserted_codeword, indicates the codeword most recently inserted into the codeword dictionary module 232, which prevents the encoder 204 from sending a codeword before defying it. Finally, a 5-bit register, string_length, tracks how many characters are contained in string_code+char.

The state machine 300 of FIG. 6, begins operation in an IDLE state 304 upon system reset. Once the controller 204 asserts the proc_char signal, the state machine 300 transitions from the IDLE state 304 to a SEARCH state 308. During this transition, the string_length registers are incremented, thereby indicating the string has added another character.

In the SEARCH state 308, the search output is asserted to the codeword dictionary module 232 as an indication to search for string_code+char. Once the search is complete, the next state is determined by the state of exception. If exception is zero and string_code+char is not found, the state machine 300 transitions from the SEARCH state 308 to a SEND_CODEWORD 312, if the encoder 204 is in compressed mode. Alternatively, if the encoder 204 is in transparent mode and exception is zero and sting_code+chair is not found, the state machine 300 transitions from the SEARCH state 308 to an UPDATE_DICT state 316.

If string_code+char is found with codeword equal to last_inserted_codeword, the state machine 300 transitions from the SEARCH state 308 to a FOUND_LAST_INSERTED_CODEWORD state 320. Finally, if string_code+char is found and its codeword does not equal last_inserted_codeword, the state machine 300 transitions from the SEARCH state 300 to an ADD_TO_STRING state 324. If string_code+char is not found, it will be added to the to the codeword dictionary module 232, as described below in detail with respect to the codeword dictionary 324. Additionally, the process character module 270 will store $C_1$ (the codeword string_code+char is assigned) in last_inserted_codeword register.

In the FOUND_LAST_INSERTED_CODEWORD state 320, the state machine 300 resets last_inserted_codeword to zero, which indicates that the codeword of the most recent string_code+char added to the codeword dictionary module 232 can be sent. If the variable exception is set, the state machine 300 transitions from the FOUND_LAST_INSERTED_CODEWORD state 320 to a RESET_STRING state 328. If exception is not set, the next state is SEND_CODEWORD 312 if the encoder 204 is in compressed mode or UPDATE_DICT 316 if the encoder 204 is in transparent mode.

In the ADD_TO_STRING state 324, the state machine 300 stores the codeword corresponding to string_code+char, which was found in the codeword dictionary module 232, in string_code. If the encoder 204 is in compressed mode, the state machine 300 transitions from the ADD_TO_STRING state 324 to a DONE state 332. Alternatively, if the encoder 204 is in transparent mode, the state machine 300 transitions from the ADD_TO_STRING state 324 to a SEND_CHAR state 336.

In the SEND_CODEWORD state 312, the state machine 300 informs the data engine 228 to send the codeword stored in string_code, because string_code+char was not found and the encoder 204 is in compressed mode. Once the data engine 228 indicates that the transmission is complete, the state machine 300 transitions from the SEND_CODEWORD state 312 to the UPDATE_DICT state 316.

In the SEND_CHAR state 336, the state machine 300 informs the data engine 228 to send char. Once the transmission is complete, the state machine 300 transitions from the SEND_CHAR state 336 to the DONE state 332.

In the UPDATE_DICT state 316, the state machine 300 waits for the codeword dictionary module 232 to complete the insertion of string_code+char. Once the codeword dictionary module 232 indicates that the insertion is finished, the state machine 300 transitions from the UPDATE_DICT state 316 to the RESET_STRING state 328.

In the RESET_STRING state 328, the state machine 300 resets string_code to (char+3), which is the codeword for char. Also, string_length is reset to 1. On the next clock cycle, the state machine 300 transitions from the RESET_STRING state 328 to the DONE state 332.

In the DONE state 332, the state machine 300 asserts the proc_char_done output, which indicates to the controller 220 that the character has been processed. On the next clock cycle, the state machine 300 transitions from the DONE state 332 back to the IDLE state 304, in which the state machine 300 waits for a new character.

The data engine module 228 of FIG. 4 includes both a receive state machine and a transmit (TX) state machine, which are described hereinafter in conjunction with FIGS. 7 and 8, respectively. In general, the data engine module 228 is responsible for receiving input characters and transmitting output characters and codewords. The data engine module 228 contains a first-in, first-out (FIFO) buffer that accepts variable length bit inputs, but always outputs 8-bit data, as described in conjunction with FIGS. 7 and 8.

Figure 7:
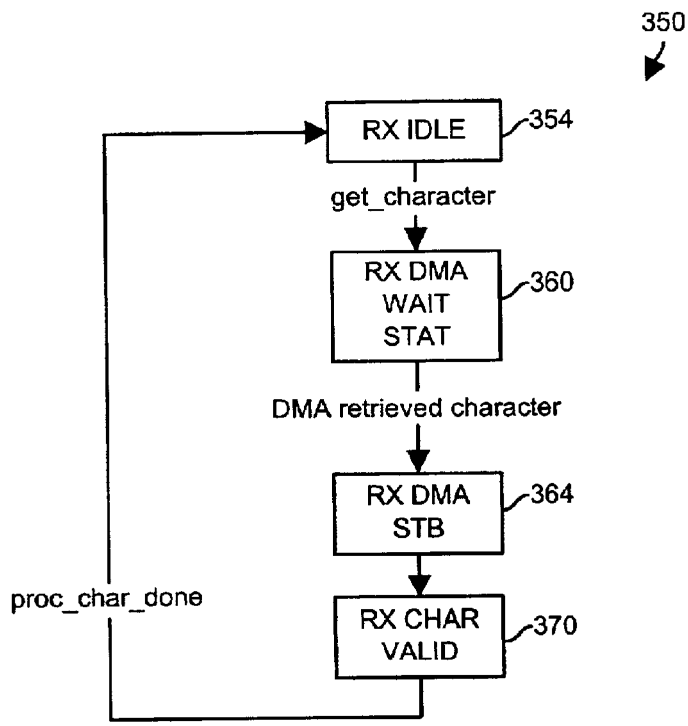
FIG. 7 is an exemplary diagram representing a receive state machine of the data engine module of FIG. 4.

Turning now to FIG. 7, an RX state machine 350 begins execution at an RX_IDLE state 354. Once the controller state machine 250 (FIG. 5) reaches the WAIT_FOR_INPUT state 266, the RX state machine 350 transitions to a RX_DMA_WAIT_STAT state 360. In the RX_DMA_WAIT_STAT state 360, the encoder 204 requests the DMA 74 to retrieve a next character from the memory 102. Once the DMA 74 indicates that the character is available, the RX state machine 350 stores the character in an 8-bit character register and transitions to a RX_DMA_STB state 364.

In the RX_DMA_STB state 364, the RX state machine 350 indicates to the DMA 74 that the character has been received. On the next clock cycle, the RX state machine 300 transitions to a RX_CHAR_VALID state 370. In this state, the RX state machine 350 asserts a character_valid output to the controller 220, thereby indicating that the encoder 204 has a new character to be processed. Once the process character module 270 asserts the proc_char_done signal, which indicates that the character has been processed, the RX state machine 350 transitions back to the RX_IDLE state 354.

Figure 8A:
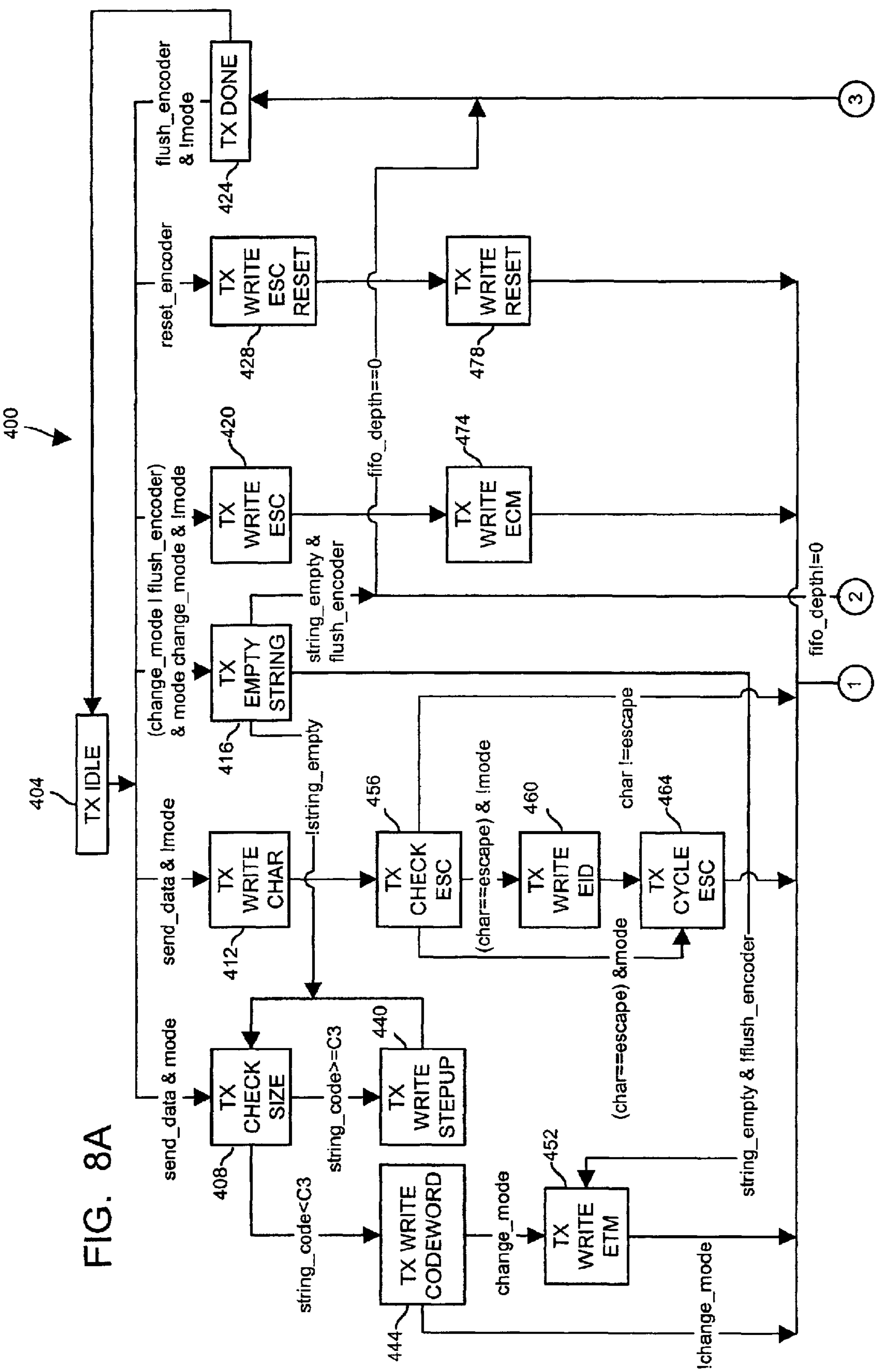
FIG. 8 is an exemplary diagram representing a transmit state machine of the data engine module of FIG. 4.
Figure 8B:
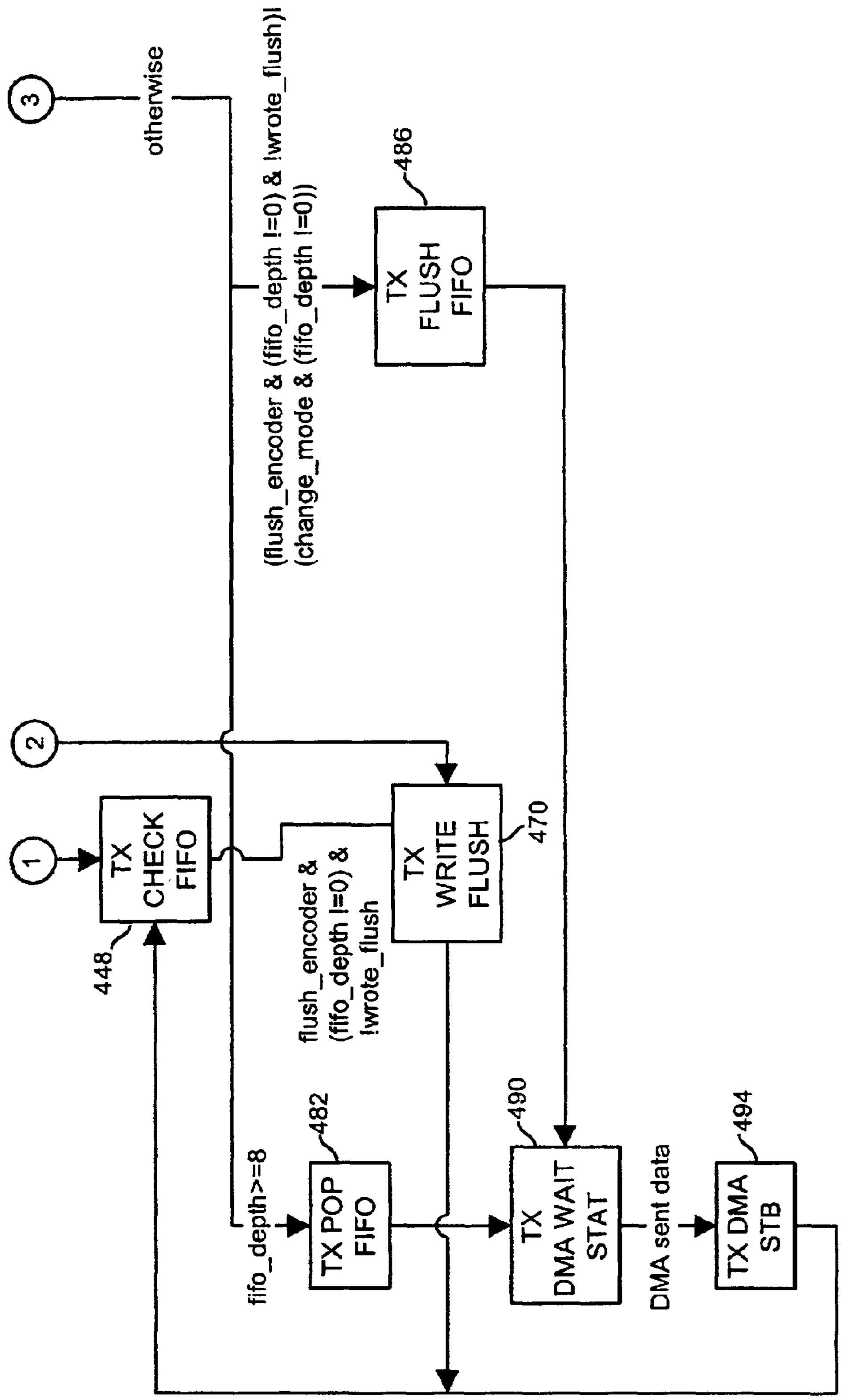

The transmit state machine 400, as shown in FIG. 8, operates in both transparent and compressed modes of operation. The compressed mode of operation is complicated by the fact that the process character module 224 sends 9, 10 or 11-bit codewords, but only 8 bits are transmitted at a time by the FIFO buffer of the data engine module 228. A variable bit input FIFO is used to solve this problem. While 8, 9, 10 or 11-bit inputs are pushed on the FIFO, only 8-bit outputs are popped from the FIFO buffer.

An 8-bit register, escape_char, is used to maintain the value of the escape character. A 4-bit register, $C_2$, is used to maintain a record of the current codeword size. A 12-bit register, $C_3$, maintains a record of the threshold for codeword size changes. $C_2$ and $C_3$ are defined as being the current codeword size and the threshold for codeword size change, respectively.

Referring to FIG. 8, the TX state machine 400 is initialized to TX_IDLE state 404 upon system reset. If the process character module 270 informs the TX state machine 400 indicates to send data and if the encoder 204 is in compressed mode, the TX state machine 400 transitions from the TX_IDLE state 404 to a TX_CHECK_SIZE state 408. Alternatively, if the encoder 204 is in transparent mode and the process character module 270 indicates to send data, the TX state machine 400 transitions from the TX_IDLE state 404 to a TX_WRITE_CHAR state 412.

If the controller 220 indicates to change the mode of the encoder 204 and the encoder 204 is in compressed mode, the TX state machine 400 transitions from the TX_IDLE state 404 to a TX_EMPTY_STRING 416. Alternatively, if the controller 220 indicates to change mode and the encoder 204 is in transparent mode, the TX state machine 400 transitions from the TX_IDLE state 404 to a TX_WRITE_ESC state 420.

If the controller 220 indicates that the encoder 204 should be flushed and, if the encoder 204 is in compressed mode, the TX state machine 400 transitions from the TX_IDLE state 404 to the TX_EMPTY_STRING state 416. Alternatively, if the controller 220 indicates to flush the encoder 204 and the encoder 204 is in transparent mode, the TX state machine 400 transitions from the TX_IDLE state 404 to a TX_DONE state 424.

If the controller 220 indicates that the encoder 204 is to be reset, the TX state machine 400 transitions from the TX_IDLE state 404 to a TX_WRITE_ESC_RESET state 428. Finally, if none of the foregoing conditions are met, the TX state machine 400 remains in the TX_IDLE state 404.

In the TX_CHECK_SIZE state 408, the TX state machine 400 compares string_code (from the process character module 270) with $C_3$, which is the threshold for codeword size change. If string_code is greater than or equal to $C_3$, the number of bits used to represent the codeword must be incremented. Accordingly, the next state is a TX_WRITE_STEPUP state 440. Otherwise, codeword can be represented in $C_2$ bits, and the next state is a TX_WRITE_CODEWORD state 444.

In the TX_WRITE_STEPUP state 440, the control codeword for STEPUP (0x2) is pushed onto the FIFO with a width of $C_2$ bits and $C_2$ is incremented and $C_3$ is multiplied by 2. On the next clock cycle, the TX state machine 400 transitions to the TX_CHECK_SIZE state 408.

In the TX_WRITE_CODEWORD state 444, string_code is pushed onto the FIFO with a width of $C_2$ bits. If the change_mode signal from the controller is not asserted, the next state is a TX_CHECK_FIFO state 448. Otherwise the next state is a TX_WRITE_ETM state 452, in which the control codeword for ETM (0x0) is pushed onto the FIFO with a width of $C_2$ bits.

In the TX_WRITE_CHAR state 412, the TX state machine 400 pushes character onto the FIFO with a width of 8 bits. On the next clock cycle, the TX state machine 400 transitions from the TX_WRITE_CHAR state 412 to a TX_CHECK_ESC state 456.

In the TX_CHECK_ESC state 456, char is compared with escape_char. If the two are equal and the encoder 204 is in transparent mode, the TX state machine 400 transitions from the TX_CHECK_ESC state 456 to a TX_WRITE_ED state 460. Alternatively, if the two are equal and the encoder is in compressed mode, the TX state machine 400 transitions to a TX_CYCLE_ESC state 464. If char does not equal escape_char, the next state is the TX_CHECK_FIFO state 448.

In the TX_WRITE_EID state 460, the command code for EID (0x1) is pushed onto the FIFO with a width of 8 bits. On the next clock cycle, the TX state machine 400 transitions to the TX_CYCLE_ESC state 464. In the TX_CYCLE_ESC state 464, escape_char is incremented by 51 modulo 256. On the next clock cycle, the TX state machine 400 transitions to the TX_CHECK_FIFO state 464.

In the TX_EMPTY_STRING state 416, the TX state machine 400 evaluates string_empty from the controller 220. If string_empty is clear (zero), the TX state machine 400 transitions from the TX_EMPTY_STRING state 416 to the TX_CHECK_SIZE state 408, because valid data that must be sent is stored in string_code. If both string_empty and flush_encoder are set by the controller 220 and the FIFO is not empty, the TX state machine 400 transitions to a TX_WRITE_FLUSH state 470. Alternatively, if both string_empty and flush_encoder are set from the controller 220 and the FIFO is empty, the TX state machine 400 transitions to the TX_DONE state 424. Finally, if string_empty is set, but flush_encoder is clear, the TX state machine 400 transitions to the TX_WRITE_ETM state 452.

In the TX_WRITE_FLUSH state 470, the control codeword for FLUSH (0x1) is pushed onto the FIFO with a width of $C_2$ bits. At the same time, the local register wrote_flush is set to one, indicating that FLUSH was written to the FIFO. On the next clock cycle, the TX state machine 400 transitions to the TX_CHECK_FIFO state 448.

In the TX_WRITE_ESC state 420, the current value of escape_char is pushed onto the FIFO with a width of 8 bits. On the next clock cycle, the TX state 400 machine transitions to a TX_WRITE_ECM state 474. In this state, the command code for ECM (0x0) is pushed onto the FIFO with a width of 8 bits. On the next clock cycle, the TX state machine 400 transitions to the TX_CHECK_FIFO state 448.

In the TX_WRITE_ESC_RESET state 428, the current value of escape_char is pushed onto the FIFO with a width of 8 bits. On the next clock cycle, the TX state machine 400 transitions to a TX_WRITE_RESET state 478, in which the command code for RESET (0x2) is pushed onto the FIFO with a width of 8 bits. On the next clock cycle, the TX state machine 400 transitions to the TX_CHECK_FIFO state 448.

In the TX_CHECK_FIFO state 448, the depth of the FIFO (in bits), which is represented by fifo_depth, is compared with 8. If fifo_depth is greater than or equal to 8, there is sufficient data in the FIFO to transmit and the TX state machine 400 transitions to a TX_POP_FIFO state 482. Alternatively, there is insufficient data in the FIFO to transmit an octet of data. If flush_encoder is asserted and the FIFO is empty, the TX state machine 400 transitions to the TX_DONE state 424, because there are no more data to transmit. Alternatively, less than 8 bits of data remain to be transmitted. If wrote_flush is one, the TX state machine 400 transitions from the TX_CHECK_FIFO state 448 to a TX_FLUSH_FIFO state 486. If wrote_flush is zero, the TX state machine 400 transitions from the TX_CHECK_FIFO state 448 to the TX_WRITE_FLUSH state 470. Alternatively, if fifo_depth is less than 8 and change_mode is asserted, all data in the FIFO must be flushed. Accordingly, the TX state machine 400 transitions from the TX_CHECK_FIFO state 448 to the TX_FLUSH_FIFO state 486. If none of the foregoing conditions is met, no further action is required and the TX state machine 400 transitions to the TX_DONE state 424.

In the TX_POP_FIFO state 482, the oldest value in the FIFO is popped and denoted as a variable called fifo_data_out. On the next clock cycle, the TX state machine 400 transitions to a TX_DMA_WAIT_STAT state 490, in which the TX state machine 400 waits for the DMA 74 to indicate that it transmitted fifo_data_out. After the execution of the TX_DMA_WAIT_STAT state 490, the TX state machine 400 transitions to a TX_DMA_STB state 494. In this state, the TX state machine 400 acknowledges the DMA 74 and transitions to the TX_CHECK_FIFO state 448.

In the TX_FLUSH_FIFO state 448, the TX state machine 400 requests a FIFO flush. The FIFO responds by zero-padding any remaining bits onto fifo_data_out to preserve octet alignment. On the next clock cycle, the TX state machine 400 transitions to the TX_DMA_WAIT_STAT state 490.

Figure 9:
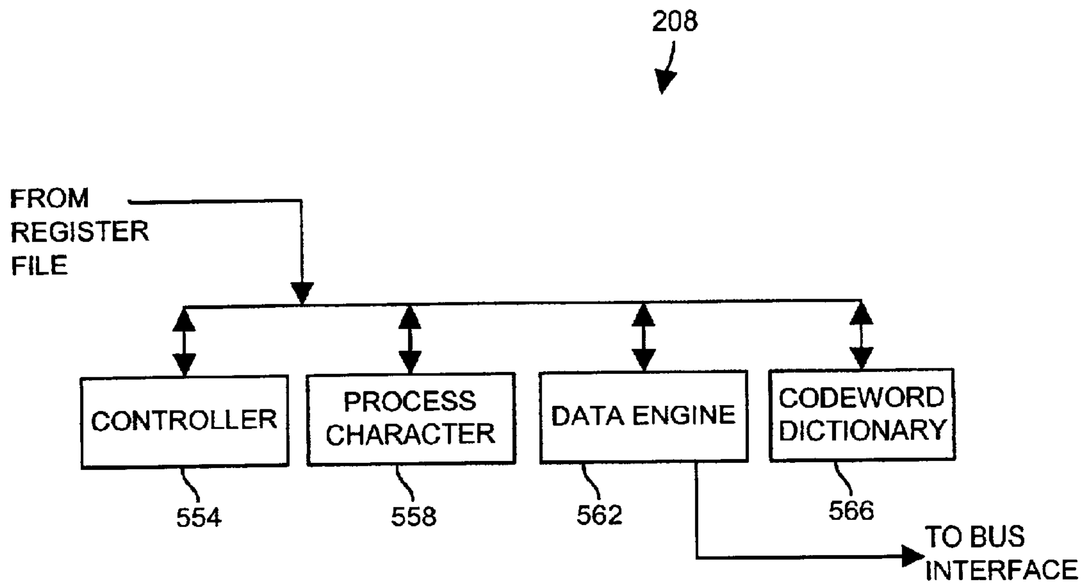
FIG. 9 is an exemplary block diagram representing a state machine of the decoder of FIG. 3.

Referring now to FIG. 9, the decoder 208 includes a controller module 554, a process data module 558, a data engine module 562 and a decoder dictionary module 566, all of which may be interconnected by a bus 570. In operation, the decoder 208 decompresses codewords into character data and exchanges data, either character data or codewords, with the processor 70 or the DMA 74. The main functions of the encoder 204, as described in detail hereinafter, include communications with the decoder dictionary that may be embodied in the memory 102 to, for example, look up strings, to update the decoder dictionary and to remove nodes from the decoder dictionary. The decoder 208 supports both transparent and compressed modes of operation and also performs compressibility tests to switch between the compressed and transparent modes of operation. Further, the decoder 208 supports peer-to-peer communication.

Each of the decoder modules 554–556 is described in detail hereinafter with respect to FIGS. 10–20. In particular, FIGS. 10–20 represent a number of state machines having various states through which the state machines cycle. As will be readily appreciated by those having ordinary skill in the art, such state machines may be implemented in hardware using gates such as flip-flops, or any other suitable hardware components. The following description of state machines adopts the nomenclature of all capital letters when referring to states and lower case letters when referring to transitions between states. Additionally, as with the previous description pertaining to state machines, the following description refers to various registers, signals or variable names, which are shown in italic typeface.

Figure 10:
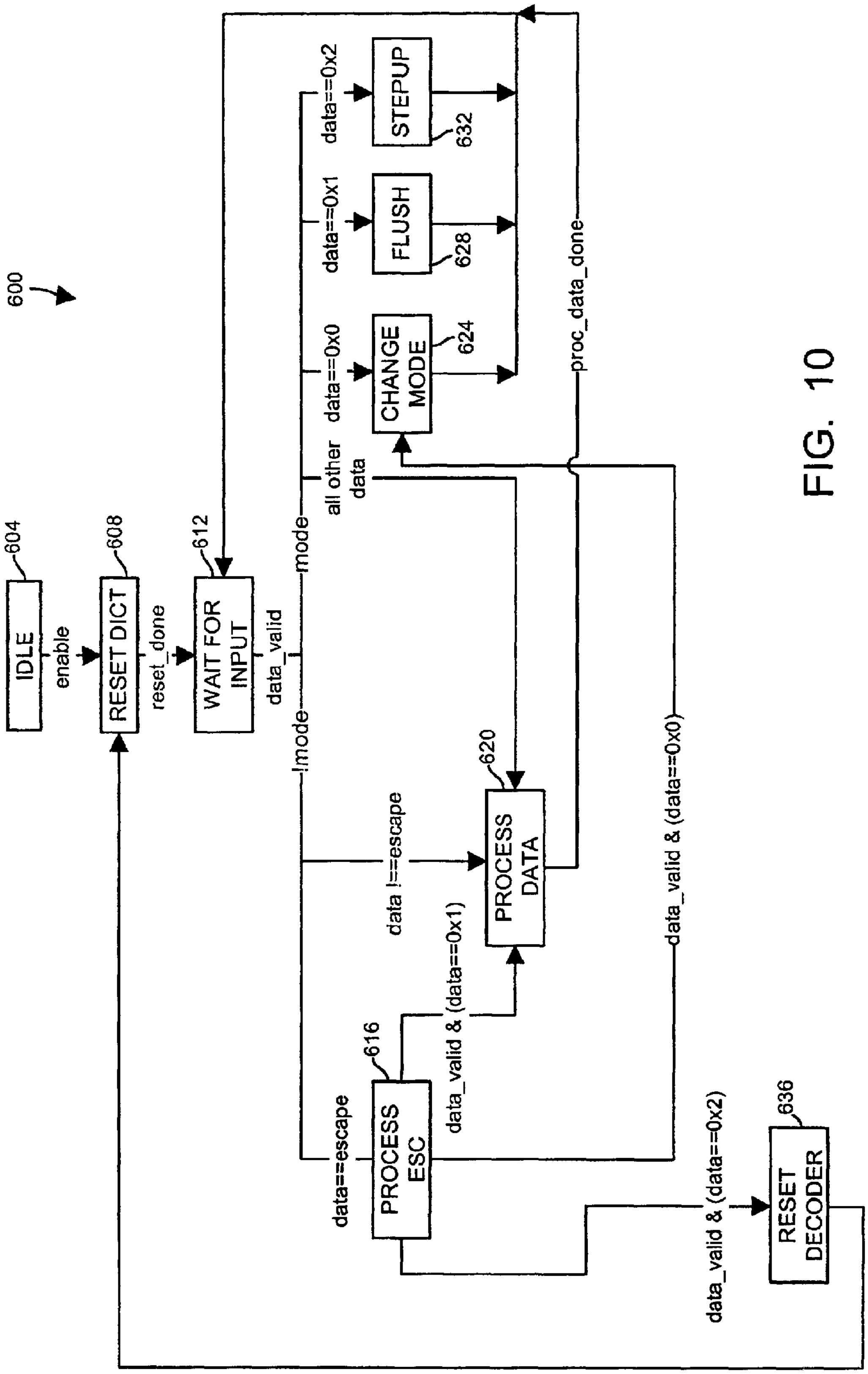
FIG. 10 is an exemplary diagram representing a state machine of the decoder controller module of FIG. 9.

As shown in FIG. 10, the controller module 554 of FIG. 9 may be represented as a controller state machine 600, which controls the overall functionality of the decoder 208. The controller module 554 maintains the following registers: escape_character, $C_2$, exception, and mode. Escape_character contains the current value for the escape character, which is a special character used for peer-to-peer communications. $C_2$ stores the codeword size. The exception register indicates if the data must be processed as an exception (after a flush), which is thoroughly described in the V.42bis specification. The mode register stores the current mode of the decoder 208. If mode is 0, the decoder 208 is in transparent mode and if mode is 1, the decoder 208 is in compressed mode.

The controller state machine 600 initializes to an IDLE state 604 upon system reset. Once the decoder 208 is enabled, the controller state machine 600 transitions from the IDLE state 604 to a RESET_DICT state 608. In the RESET_DICT state 608, the codeword dictionary module 566 is directed to initialize itself. Additionally, after initialization, both escape_character and mode are reset to 0. Once these operations are complete the controller state machine 600 transitions to a WAIT_FOR_INPUT state 612.

In the WAIT_FOR_INPUT state 612, the controller state machine 600 requests the data engine module 562 to retrieve data. If the decoder 208 is in transparent mode, the data engine module 562 will retrieve an 8-bit character. Alternatively, if the decoder 208 is in compressed mode, the data engine module 562 will retrieve a $C_2$ bit codeword.

Once the data engine 562 indicates that data is available by asserting a variable called data_valid, the controller state machine 600 determines the next state.

If the decoder 208 is in transparent mode and the character equals escape_char, the controller state machine 600 transitions to a PROCESS_ESC state 616. Otherwise the controller state machine 600 transitions to a PROCESS_DATA state 620. If the decoder 208 is in compressed mode, the codeword is compared with the control codewords. If the codeword is ETM (0x0), the controller state machine 600 transitions from the WAIT_FOR_INPUT state 612 to a CHANGE_MODE state 624. If the codeword is FLUSH (0x1), the controller state machine 600 transitions to a FLUSH state 628. If the codeword is STEPUP (0x2), controller state machine 600 transitions to a STEPUP state 632. Finally, if the codeword does not equal any of the above control codewords, the next state is the PROCESS_DATA state 620.

In the PROCESS_ESC state 616, another character is requested from the data engine module 562. The requested character is compared with the command codes. If the requested character equals ECM (0x0), the next state is the CHANGE_MODE state 624. If the requested character equals EID (0x1), the next state is the PROCESS_DATA state 620 and escape_char is incremented by 51 modulo 256. Alternatively, if the new character equals RESET (0x2), the controller state machine 600 transitions to a RESET_DECODER state 636.

In the RESET_DECODER state 636, escape_character is reset to 0x0 and $C_2$ is reset to 0x9. On the next clock cycle, the controller state machine 600 transitions from the RESET_DECODER state 636 to the RESET_DIC state 608.

In the PROCESS_DATA state 620, proc_data is asserted to the process data module 558 to indicate that data was retrieved. Once the process data module is finished, which is indicated by a variable called proc_data_done, exception is reset to 0 and the controller state machine 600 transitions back to the WAIT_FOR_INPUT state 612.

In the CHANGE_MODE state 624, exception is set to 1 and mode is toggled. On the next clock cycle, the controller state machine 600 transitions to the WAIT_FOR_INPUT state 612.

In the FLUSH state 628, if the decoder 208 is in compressed mode, exception is set to 1. On the next clock cycle, the controller state machine 600 transitions to the WAIT_FOR_INPUT state 612.

In the STEPUP state 632, $C_2$ is incremented. On the next clock cycle, the controller state machine 600 transitions to the WAIT_FOR_INPUT state 612.

Figure 11:
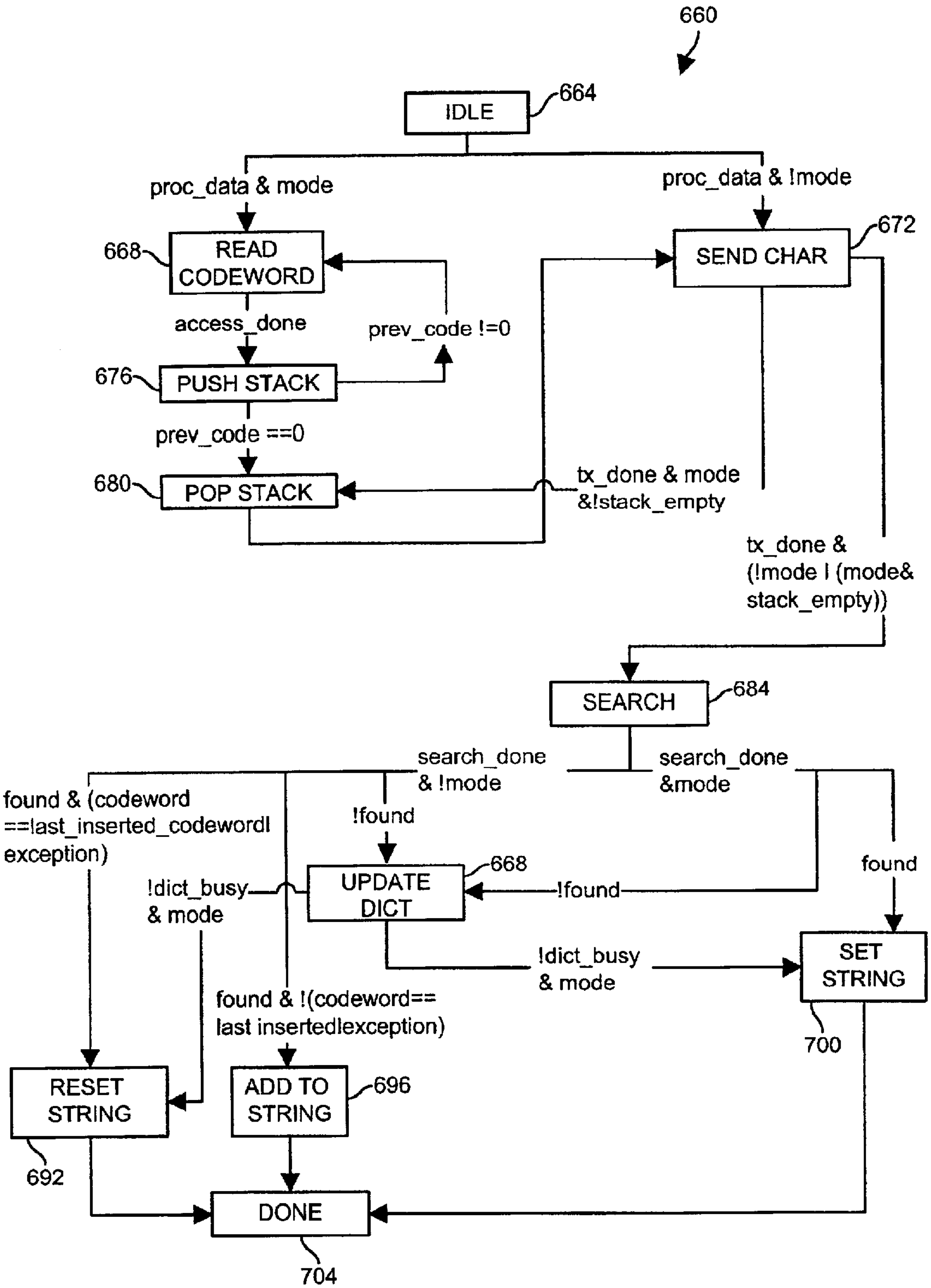
FIG. 11 is an exemplary diagram representing a state machine of the process data module of FIG. 9.

As shown in FIG. 11, a state machine 660 for the process data module 558 of FIG. 9 includes number of states with state transitions therebetween. In general, the process data module 558 processes received characters/codewords from the data engine module 562. The process data module 558 maintains a number of registers. A register called tx_data represents the decoded data to be transmitted. A registered called last_inserted_codeword stores the most recent codeword added to the codeword dictionary module 566 and is used in the same manner as the encoder process character module 224 of FIG. 4. Registers called String_code and char represent the current string_code+char combination, respectively. A register called string_length represents the length of the string represented by string_code+char. Additionally, the process data module 558 includes a stack that is used in compressed mode to decode input codewords.

The state machine 660 of FIG. 11 is initialized to an IDLE state 664 upon system reset. The lower 8 bits of the input data from the controller 554, which are referred to as data_to_process, are stored in a register called tx_data when the state machine 660 is in the IDLE state 664. Once the controller 554 asserts proc_data, the state machine 660 transitions from the IDLE state 664 to a READ_CODEWORD state 668 if the decoder 208 is in compressed mode. Alternatively, if the decoder 208 is in transparent mode, the state machine 660 transitions from the IDLE state 664 to a SEND_CHAR state 672. As the state machine 660 transitions out of the IDLE state 664, string_length is incremented.

In the READ_CODEWORD state 668, the decoder 208 reads the dictionary entry stored at data_to_process, which is a codeword. The contents of data_to_process are stored locally as prev_code and attach_char. Once the read operation is complete, the state machine 660 transitions to a PUSH_STACK state 676.

In the PUSH_STACK state 676, attach_char is pushed onto the stack. If prev_code is zero (indicating the first character of the string has been found), char is set to attach_char (the first character of the string) and the stack depth is stored locally as new_string length (number of characters in the string), after which the state machine 660 transitions to POP_STACK 680. If prev_code does not equal zero, the state machine 660 transitions back to the READ_CODEWORD state 668, where the dictionary entry stored at prev_code is read.

In the POP_STACK state 680, the most recent entry in the stack is removed and stored in tx_data. On the next clock cycle, the state machine 660 transitions to the SEND_CHAR state 672.

In the SEND_CHAR state 672, the data engine module 562 is directed to send tx_data. If the decoder 208 is in transparent mode, char is set to data_to_process[7:0]. Once tx_data has been transmitted, the next state is determined. If the decoder 208 is in transparent mode, the state machine 660 transitions to a SEARCH state 684. Alternatively, if the decoder 208 is in compressed mode and character stack is not empty, the state machine 660 transitions to the POP_STACK state 680 to get the next character in the string. Finally, if the decoder 208 is in compressed mode and the character stack is empty, the state machine 660 transitions to the SEARCH state 684, because the last character in the string has been transmitted.

In the SEARCH state 684, the codeword dictionary module 566 is directed to search for string_code+char. The codeword dictionary module 566 will automatically assign a codeword (C1) to string_code+char. Alternatively, if string_code+char is not found, it will be added to the codeword dictionary module 566. Once the codeword dictionary module 566 indicates that the search is complete, the next state is determined.

If the decoder 208 is in transparent mode and string_code+char is not found, the next state is an UPDATE_DICT state 688. If string_code+char is found and the codeword corresponding to string_code+char equals last_inserted_codeword, the next state is a RESET_STRING state 692. Additionally, if string_code+char is found and exception is set, the next state is the RESET_STRING. Finally if string_code+char is found and the above two conditions are not met, the state machine 660 transitions to an ADD_TO_STRING state 696 and last_inserted_codeword is reset to zero. In compressed mode, the state machine 660 transitions to a SET_STRING state 700 if string_code+char is found and transitions to the UPDATE_DICT state 688 if string_code+char is not found. Also, if string_code+char is not found, last_inserted_codeword is replaced with $C_1$, the codeword that string_code+char will be assigned.

In the ADD_TO_STRING state 696, string_code is replaced with codeword found in the SEARCH state 684. On the next clock cycle, the state machine 660 transitions to a DONE state 704.

In the UPDATE_DICT state 688, the state machine 660 waits for the codeword dictionary module 566 to complete its operation. Once complete, the state machine 660 transitions to the SET_STRING state 700 if the decoder 208 is in compressed mode or to the RESET_STRING state 692 if the decoder 208 is in transparent mode.

In the SET_STRING state 700, string_code is assigned the input codeword, data_to_process and string_length is assigned new_string_length, which is the length of the string represented by data_to_process. On the next clock cycle, the state machine 660 transitions to the DONE state 704.

In the RESET_STRING state 692, string_code is assigned the codeword that represents the input character, or data_to_process[7:0]+3 and String_length is reset to 1. On the next clock cycle, the state machine 660 transitions to the DONE state 704.

In the DONE state 704, the state machine 660 asserts proc_data_done to the decoder controller module 554, thereby indicating that the process data module 558 has processed data_to_process. On the next clock cycle, the state machine 660 transitions to the IDLE state 664.

Figure 12:
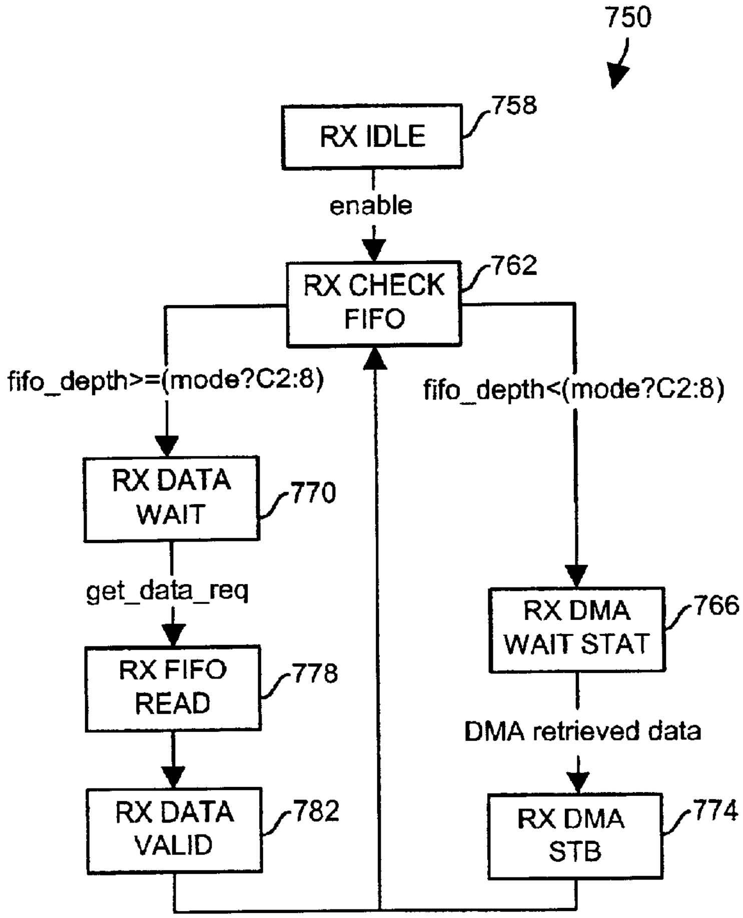
FIG. 12 is an exemplary diagram representing a receive state machine of the data engine module of FIG. 9.
Figure 13:
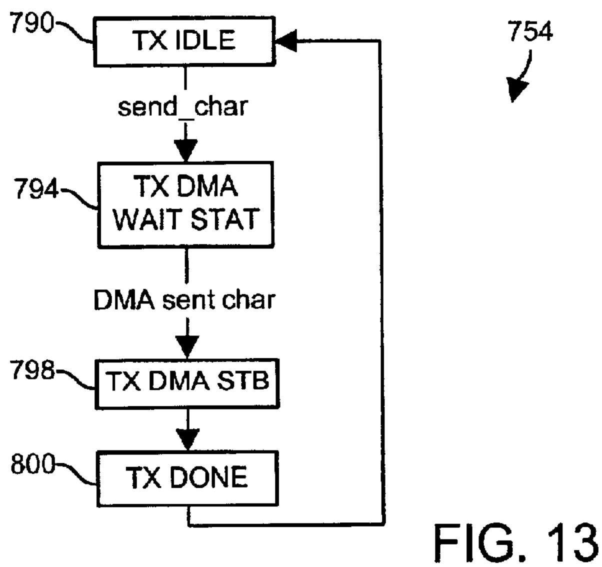
FIG. 13 is an exemplary diagram representing a transmit state machine of the data engine module of FIG. 9.

The data engine module 562 of the decoder 208 receives character/codeword data and transmits decoded characters. As shown in FIGS. 12 and 13, the data engine module 562 includes a receive (RX) state machine 750 and a transmit (TX) state machine 754.

The data engine module 562 also includes a variable bit output, 8-bit input RX FIFO. The RX FIFO is used to align the data according to the mode of the decoder 208 (compressed or transparent). The RX FIFO receives 8-bit inputs, but can output variable bit length data. A 32-bit register, named mem, is used to store the data. A 5-bit register, named addr_in, is a pointer to the next available bit in mem.

When data is written to the RX FIFO, it is shifted by addr_in, and stored in mem so that data[0] is stored in mem[addr_in] and data[7] is stored in mem[addr_in+7], and addr_in is incremented by 8. When data is read from the RX FIFO, the data engine 562 of FIG. 9 must indicate how many bits are to be read. The number of bits to be read is denoted as fifo_data_out_size. The appropriate number of bits are stored in the 11-bit register named fifo_data_out. If fifo_data_out_size equals 8, fifo_data_out is set to {3'b0, mem[7:0]}. If fifo_data_out_size equals 9, fifo_data_out is set to {2'b0, mem[8:0]}, and so on. Subsequently, mem is left shifted by fifo_data_out_size so that mem[31:0] is assigned {0x0, mem[31:fifo_data_out_size]}. Finally, addr_in is decremented by fifo_data_out_size.

The RX state machine 750 is initialized to an RX_IDLE state 758 upon system reset. Once the decoder 208 is enabled, the state machine 750 transitions from the RX_IDLE state 758 to an RX_CHECK_FIFO state 762. In this state, the depth of the RX FIFO is analyzed. If there are not enough data stored in the RX FIFO (at least $C_2$ bits if the decoder 208 is in compressed mode or 8 bits if the decoder 208 is in transparent mode) the state machine 750 transitions to from the RX_CHECK_FIFO state 762 to a RX_DMA_WAIT_STAT_state 766 to request more data from the DMA 74. Otherwise, there is enough data and the state machine 750 transitions to an RX_DATA_WAIT state 770.

In the RX_DMA_WAIT_STAT state 766, the state machine 750 waits for data from the DMA 74. Once the DMA 74 signals it has new data, the state machine 750 transitions to an RX_DMA_STB state 774. In this state, the data from the DMA 74 is pushed onto the RX FIFO and a strobe is sent to the DMA 74 to acknowledge receipt of the data. On the next clock cycle, the state machine 750 transitions back to the RX_CHECK_FIFO state 762.

In the RX_DATA_WAIT state 770, the state machine 750 awaits a data request from the controller module 554. Once the state machine 750 receives the request, the state machine 750 transitions to an RX_FIFO_READ state 778, in which the oldest data in the RX FIFO is popped. The size of the data in the RX FIFO depends on the mode of the decoder 208. If the decoder 208 is in compressed mode, $C_2$ bits will be popped from the RX FIFO. If the decoder 208 is in the transparent mode, 8 bits will be popped from the RX FIFO. On the next clock cycle, the state machine 750 transitions to an RX_DATA_VALID state 782.

In the RX_DATA_VALID state 782, the state machine 750 asserts the rx_data_valid signal to inform the controller 554 that valid data is ready to be processed. On the next clock cycle, the state machine 750 transitions back to the RX_CHECK_FIFO state 762.

The TX state machine 754 of FIG. 13 begins operation in a TX_IDLE state 790. Once the process data module 558 indicates that it has a character to send, the state machine 754 transitions to a TX_DMA_WAIT_STAT state 794. In this state 794, the state machine 754 waits for the DMA 74 to send a character. Once the DMA 74 sends a character, the state machine 754 transitions to a TX_DMA_STB state 798. In this state, the state machine 754 acknowledges that the DMA transfer is complete and transitions to a TX_DONE state 800 on the next clock cycle. In the TX_DONE state 800, the state machine 754 asserts tx_done to the process data module 558 to indicate that the state machine 754 is finished sending the character. On the next clock cycle, the state machine 754 transitions back to the TX_IDLE state 790.

Figure 14:
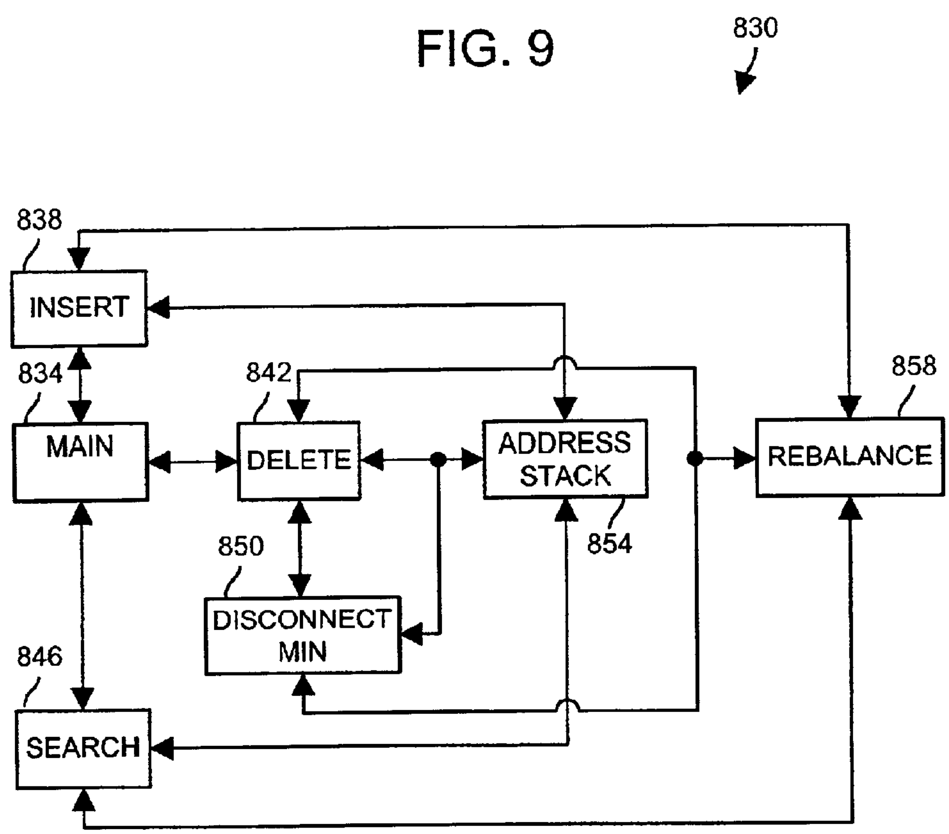
FIG. 14 is an exemplary block diagram representing a codeword dictionary state machine that may be implemented in either or both of the encoder and the decoder of FIG. 3.

Turning now to FIG. 14, a block diagram of a codeword dictionary 830, such as either of the codeword dictionary modules 232 and 566 shown in the encoder 204 and the decoder 208 respectively, is shown. Although only a single description of the codeword dictionary 830 is provided, it should be understood that the same codeword dictionary may be instantiated two times, one for each of the encoder 204 and decoder 208. The codeword dictionary 830 performs various functions involving the encoder and decoder dictionaries, each of which may be embodied in the memory 102. The following description makes general reference to a dictionary or to dictionaries, it being understood that such a dictionary or dictionaries may be either or both of the encoder or decoder dictionaries. The various functions performed by the codeword dictionary 830 include, for example, initializing a dictionary, searching a dictionary for the existence of a string and adding strings or nodes to a dictionary. Additionally, the codeword dictionary 830 removes nodes from a dictionary when the dictionary is full.

In general, the codeword dictionary 830 stores a codeword and its corresponding string. To reduce the storage requirements, each node of the dictionary stores an attach character and the previous string code. The V.42bis standard allows for deletion of leaf nodes, which are nodes whose codewords are not used as a previous string code of any other node. A reference count is used for each node to track how many other nodes reference it. Table 3 shows an example of strings, their codeword, their previous codeword, their attach character, and their reference count values.

TABLE 3

| String | Codeword | Previous Codeword | Attach Character | Reference Count Value |
|---|---|---|---|---|
| 123 | 260 | 259 | 3 | 0 |
| 12 | 259 | 4 | 2 | 1 |
| 1 | 4 | 0 | 1 | 1 |

The size of the previous codeword is 11 bits, which is the maximum codeword size. The attach character is 8 bits long and the reference count value is 4 bits long.

Each node also stores the AVL node information including, for example, the left and right child pointers and a balance factor. Because the dictionary size is limited to 2048 codewords, the left and right child pointers must be 11 bits long. The balance factor can range between −2 and +2 and is, therefore, 3 bits in length.

Each node of the dictionary uses 64 bits of memory that are arranged as follows:

right_child[10:0]=mem[10:0]

left_child[10:0]=mem[21:11]

balance_factor[2:0]=mem[24:22]

attach_char[7:0]=mem[32:25]

prev_code[10:0]=mem[43:33]

reference_count[3:0]=mem[47:44]

Bits 63:48 are presently unused, but allow for future flexibility to increase the dictionary size and/or codeword size. The address offset of each node is that node's codeword multiplied by eight. For example, codeword 3 is stored at offset 0x18, because the 0x03*8 is 0x18. Further, the codeword 4 is stored at offset 0x20 because 0x04*8 is 0x20. Therefore, the amount of memory needed to store each codeword dictionary is 64*$N_2$ bits. For $N_2$ equal to 2048, the storage requirement is 131,052 bits for both the encoder and decoder dictionaries.

As shown in FIG. 14, the codeword dictionary 830 includes a number of functions or modules that may be represented in detail as state machines. In particular, the codeword dictionary 830 includes a main module 834 that is coupled to each of an insert module 838, a delete module 842 and a search module 846. Additionally, the codeword dictionary 830 includes a disconnect min module 850 that is coupled to each of the delete module 842, an address stack module 854 and a rebalance module 858. Further detail on each of the modules 834–858 is provided hereinafter in conjunction with FIGS. 15–20.

Figure 15:
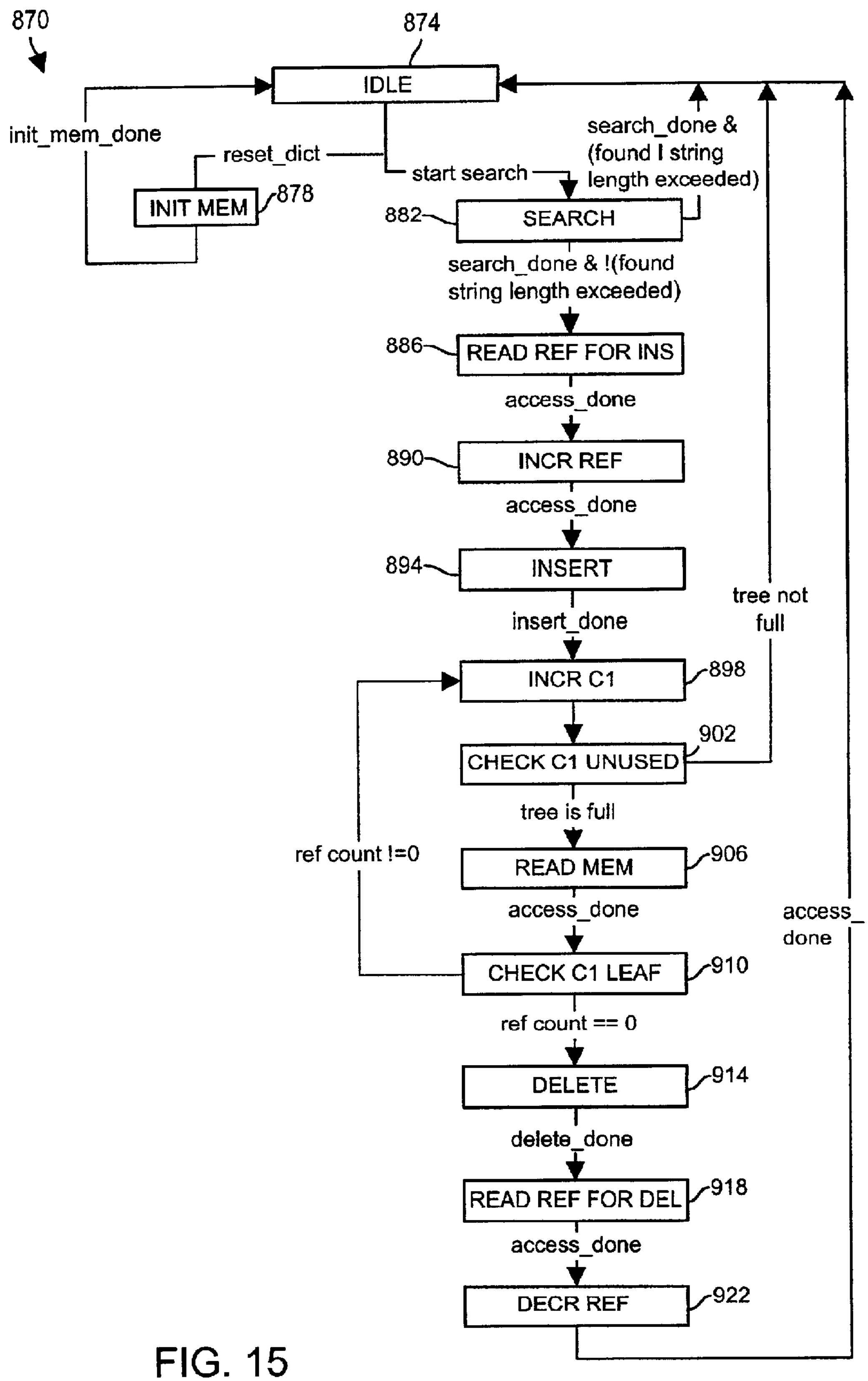
FIG. 15 is an exemplary block diagram representing a state machine of the main module of FIG. 14.

Referring to FIG. 15, a main state machine 870, which represents further detail of the main module 834 of FIG. 14, is shown. The main state machine 870 controls the functionality of the codeword dictionary 830 and also includes logic that initializes the codeword dictionary 830. The main module 830 includes register elements that may be used to store the tree root, tree depth and $C_1$.

The main state machine 870 begins execution in an IDLE state 874. Upon a dictionary reset request, the main state machine 870 transitions to an INIT_MEM state 878. According to the V.42bis standard, the dictionary (e.g., the encoder dictionary or the decoder dictionary) must be preloaded with characters 0 through 255, which correspond to codewords 3 through 258, respectively (because codewords 0, 1 and 2 are reserved). The balance of the dictionary (from codeword 259 to $N_2$−1), must be initialized to zero. Because inserting 256 codewords using a standard AVL insert algorithm would be time consuming, the initialization is performed by storing the absolute node values because the number and value of the nodes is known. Accordingly, initialization requires just $N_2$ memory accesses. The tree root is initialized to 130, the tree depth is initialized to 256 and $C_1$ is initialized to 259. Once initialization is complete, the state machine transitions from the INIT_MEM state 878 back to the IDLE state 874.

On a search request for string_code+char, the main state machine 870 transitions from the IDLE state 874 to a SEARCH state 882, at which point the main state machine 870 signals the search module 846 to begin execution. If the search module 846 finds the string_code+char in the AVL tree, the main state machine 870 returns to the IDLE state 874. Alternatively, if the search module 846 does not find the string_code+char in the AVL tree, the string_code+char must be inserted only if the maximum string length ($N_7$) is not exceeded. If these conditions are met, the main state machine 870 transitions to the READ_REF_FOR_INS state 886. If string_code+char is not found and exceeds the maximum string length, string_code+char will not be inserted and the main state machine 870 will transition back to the IDLE state 874.

In the READ_REF_FOR_INS state 886, the main state machine 870 will read the tree node that represents the codeword string_code. Next, the main state machine 870 transitions to an INCR_REF state 890 in which the reference count for string_code is incremented and the tree node for string_code is written with the updated reference count. Once the functions of the state 890 are complete, the main state machine 870 transitions to an INSERT state 894.

In the INSERT state 894, the main state machine 870 enables the insert module 838 to add a new node to the AVL tree with codeword $C_1$ representing string_code+char. Once the insertion is complete, the main state machine 870 transitions to an INCR_C1 state 898, at which $C_1$ is incremented.

After the state 898 has completed, the main state machine 870 transitions to a CHECK_C1_UNUSED state 902. If the tree is not fill, meaning (tree_depth+3)<$N_2$, no deletion is required and the main state machine 870 transitions back to the IDLE state 874. Otherwise, the tree is full and the main state machine 870 transitions to a READ_MEM state 906.

In the READ_MEM state 906, the tree node represented by codeword $C_1$ is read. Once the read operation is complete, the main state machine 870 transitions to a CHECK_C1_LEAF state 910. This state is used to determine if the codeword stored in $C_1$ is a leaf node, which is a point on a tree representing the last character in a string. If the reference_count of a codeword is zero, the codeword is not a prev_code of any other node and is, therefore, a leaf node. For example, as shown in Table 3, the string "123" is a leaf node.

If the node is a leaf node, the main state machine 870 will transition from the CHECK_C1_LEAF state 910 to a DELETE state 914. Alternatively, if reference_count is non-zero, the node is not a leaf and the main state machine 870 transitions from the CHECK_C1_LEAF state 910 back to the INCR_C1 state 898 to repeat the process until a leaf node is found.

Once in the DELETE state 914, the main state machine 870 enables the delete module 842 to delete the tree node representing the codeword $C_1$. Once the node deletion is complete, the main state machine 870 transitions from the DELETE state 914 to the READ_REF_FOR_DEL state 918, in which the node represented by the prev_code field of the deleted $C_1$ codeword is read. Once the read operation is complete, the main state machine 870 transitions to a DECR_REF state 922, in which the reference_count of the codeword is decremented and the updated node information is stored. Once this operation is complete, the state machine transitions back to the IDLE state 874.

Figure 16:
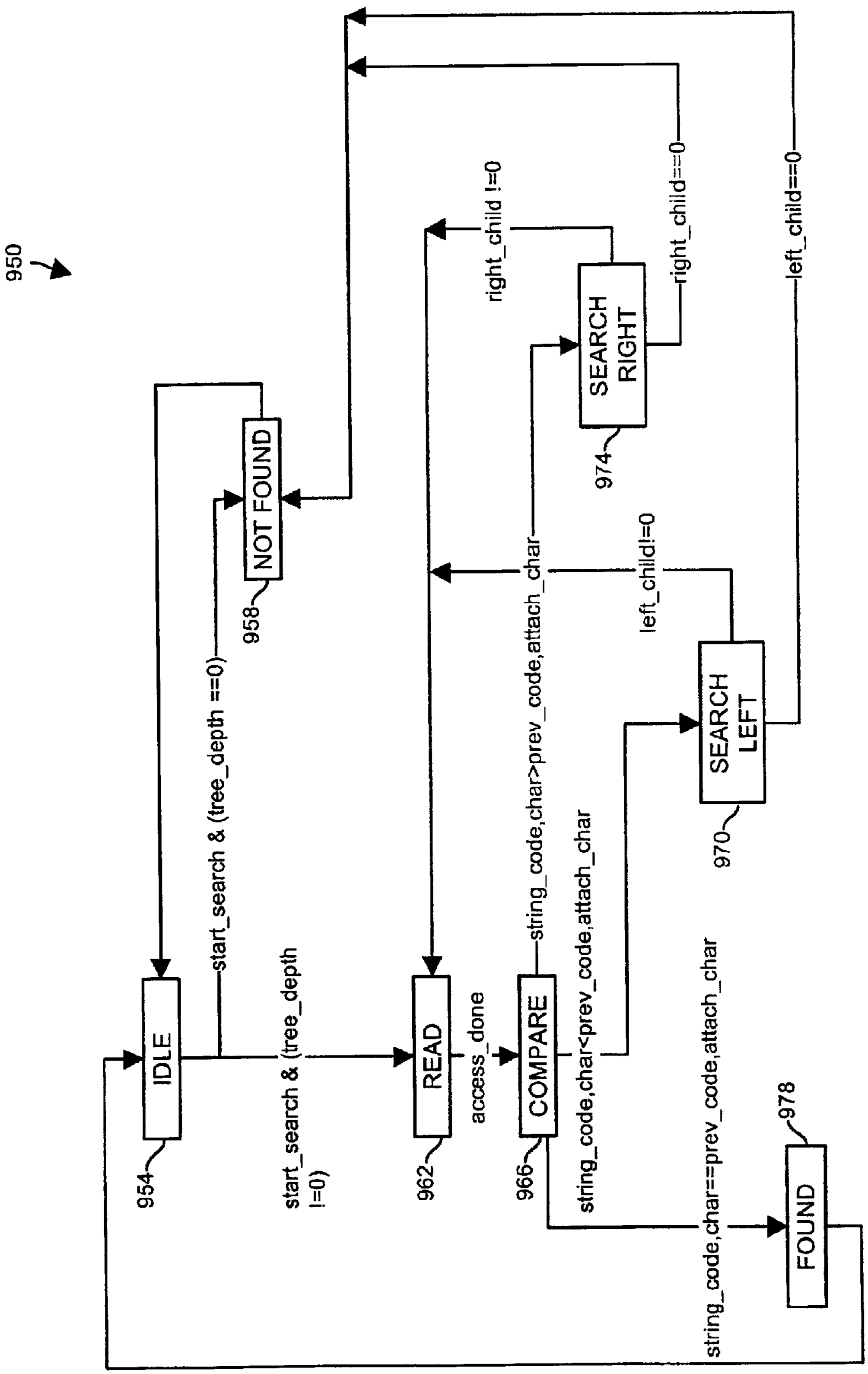
FIG. 16 is an exemplary block diagram representing a state machine of the search module of FIG. 14.

Further detail regarding the search module 846 is shown in a search state machine 950 of FIG. 16. An 11-bit storage element named addr_offset is used as the address of the tree node to be read and is initialized to be the tree root, which is where the search algorithm begins.

The search state machine 950 begins operation at an IDLE state 954. Upon receiving a search request, the search state machine 950 transitions from the IDLE state 954 to a NOT_FOUND state 958, if the tree is empty (if tree_depth=0). Otherwise, the search state machine 950 transitions to a READ state 962. In the READ state 962, the tree node located at addr_offset is read from the memory 102 and stored locally. Also, addr_offset is pushed onto the address stack to provide a path to backtrack through the dictionary (e.g., the encoder dictionary or the decoder dictionary) in the event that a new node must be inserted into one of the dictionaries, which causes the need for a balance factor adjustment. Once the read operation is complete, the search state machine 950 transitions to a COMPARE state 966.

In the COMPARE state 966, string_code+char is compared with the prev_code+attach_char read from the tree node. If string_code+char is less than prev_code+attach_char, then string_code+char is in the left subtree and the state machine transitions to a SEARCH_LEFT state 970. Conversely, if string_code+char is greater than prev_code+attach_char, then string_code+char is in the right subtree and the search state machine 950 transitions to a SEARCH_RIGHT state 974. Finally, if string_code+char is equal to prev_code+attach_char, string_code+char is in the AVL tree, the search state machine 950 transitions to a FOUND state 978.

In the SEARCH_LEFT state 970, left_child is evaluated. If left_child equals zero, there is no left subtree, and, therefore, string_code+char is not in the AVL tree and the search state machine 950 transitions to the NOT_FOUND state 958. Alternatively, addr_offset is set to left_child, which causes the search state machine 950 to transition to the READ state 962.

In the SEARCH_RIGHT state 974, right_child is evaluated. If right_child equals zero, there is no right subtree, and, therefore, string_code+char is not in the AVL tree and the search state machine 950 transitions to the NOT_FOUND state 958. Otherwise addr_offset is set to right_child, which causes the search state machine 950 to transition to the READ state 962.

In the FOUND state 978, the search state machine 950 sets the found output and sets the search_done output. After the search state machine 950 completes execution of the FOUND state 978, the search state machine 950 transitions to the IDLE state 954. Conversely, in the NOT_FOUND state 958, the search state machine 950 clears the found output and sets the search_done output and transitions to the IDLE state 954.

Figure 17:
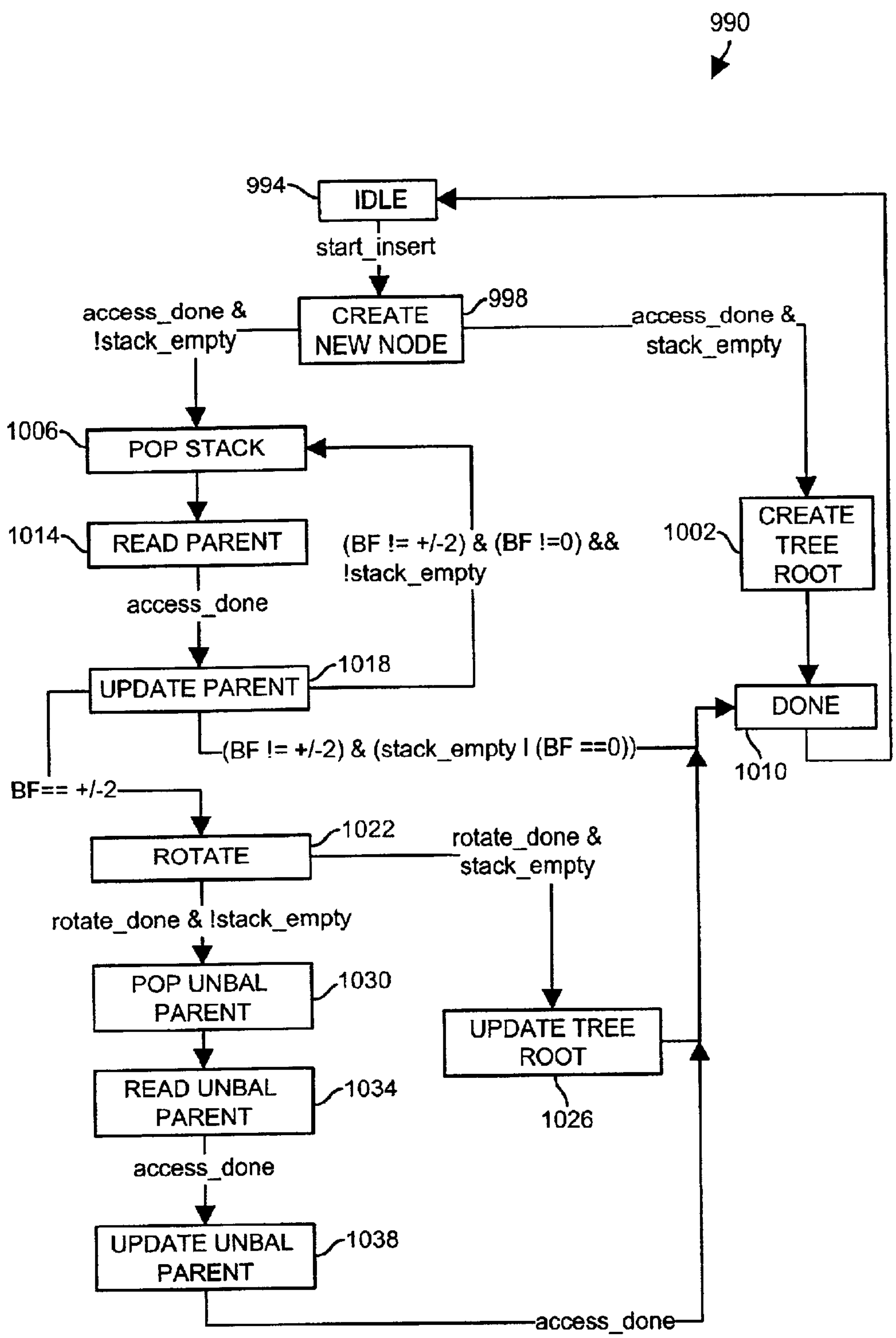
FIG. 17 is an exemplary block diagram representing a state machine of the insert module of FIG. 14.

Further detail regarding the insert module 838 is shown in an insert state machine 990 of FIG. 17. In general, the insert state machine 990 is responsible for adding a new node to the AVL tree.

The insert state machine 990 begins operation at an IDLE state 994. When the main module 834 requests string_code+char be added to the dictionary (e.g., the encoder dictionary or the decoder dictionary), which is indicated by start_insert, the insert state machine 990 transitions from the IDLE state 994 to a CREATE_NEW_NODE state 998. In state 998, a new node, called child, is created using $C_1$ as its codeword and the following contents:

prev_code=string_code
attach_char=char
reference_count=0
left_child=0
right_child=0
balance_factor=0

Once child has been stored to memory 102, the address stack is analyzed. If the stack is empty, the search module 846 did not find a parent with which to attach the new node and, therefore, a new tree root must be created. Such a situation will only arise when the tree is empty and is only used for testing. After the state 998 has completed, the insert state machine 990 transitions to a CREATE_TREE_ROOT state 1002. Alternatively, if the address stack is not empty, the insert state machine 990 transitions to a POP_STACK state 1006.

When the insert state machine 990 is in the CREATE_TREE_ROOT state 1002, the tree_root storage elements located in the main module 834 are updated with the codeword of the new node as this is the new tree root. After the state 1002 completes execution, control passes to a DONE state 1010.

In the POP_STACK state 1006, the insert state machine 990 requests that the address stack be popped. Two 11-bit storage elements, parent_addr and child_addr are used to handle addresses. The address popped from the address stack is stored in parent_addr. The old value of parent_addr is stored in child_addr. This process is a technique to maintain a parent node with its child. The address on the top of the address stack represents the parent of the new node since the search module 846 stored each node address during its search for string_code+char. This structure provides backtracking information and must be used to update the AVL balance factors. Once the address stack is popped, the insert state machine 990 transitions to a READ_PARENT state 1014.

In the READ_PARENT state 1014, parent_addr is read from the memory 102 and stored locally in a node that is denoted as a parent. Once the state 1014 completes its operation, the insert state machine 990 transitions to an UPDATE_PARENT state 1018, in which the contents of parent are updated. If child is a left child of parent, meaning string_code+char of child is less than parent's prev_code+attach_char, parent's left_child is set to child's codeword and parent's balance_factor is decremented. Similarly, if child is a right child of parent, meaning string_code+char of child is greater than parent's prev_code+attach_char, parent's right_child is set to child's codeword and parent's balance_factor is incremented. All other contents of parent remain the same. Once the write operation of the UPDATE_PARENT state 1018 completes, the next state is determined based on a number of factors. In particular, if the parent's new balance_factor is +/−2, the subtree is unbalanced and the next state is a ROTATE state 1022. Alternatively, if parent's balance_factor is 0, the subtree is balanced and not further height adjustments need to be made and the next state is the DONE state 1010. Further, if the stack is empty, there are no further nodes that may have their heights adjusted.

Accordingly, the next state is the DONE state 1010. Alternatively, height adjustments must continue, so that the next state is a POP_STACK state 1006.

When the insert state machine 990 is in the ROTATE state 1022, the state machine 990 signals the rebalance module 858 to perform rotations on the subtree whose root is the unbalanced node (balance factor is +/−2) and returns the address of the root of the balanced subtree, denoted rotate_root_addr. Once the rebalance completes, the next state is determined by the status of the address stack. If the stack is empty, meaning the unbalanced parent node that was rotated was the root of the tree, the next state is an UPDATE_TREE_ROOT state 1026. Alternatively, the next state is a POP_UNBAL_PARENT state 1030.

In the UPDATE_TREE_ROOT state 1026, the insert state machine 990 signals the main module 834 to update the address of the tree root because the address of the root tree has been changed due to a rotation about the tree root. Once complete, the state machine transitions to the DONE state 1010.

In the POP_UNBAL_PARENT state 1030, the insert state machine 990 requests the address stack to be popped. Once again, the value popped from the address stack is stored in parent_addr, with the previous value of parent_addr stored in child_addr. The address stack must be popped after a rotation because a child of this node has changed and must be updated to rotate_root_addr. This node represents the parent of the unbalanced node upon which a rotation was performed, called unbal_parent. The insert state machine 990 transitions to a READ_UNBAL_PARENT state 1034 on the next clock cycle.

In the READ_UNBAL_PARENT state 1034, the insert state machine 990 reads the contents of the unbal_parent node and stores it locally. Once the read operation completes, the insert state machine 990 transitions to an UPDATE_UNBAL_PARENT state 1038.

In the UPDATE_UNBAL_PARENT state 1038, the insert state machine 990 writes the updated contents of the unbal_parent node. Only the left_child or right_child contents of the node require updating as the balance factor must remain the same. If string_code+char is less than the prev_code+attach_char of unbal_parent, the left_child of unbal_parent is updated to rotate_root_addr. Otherwise the right_child of unbal_parent is updated to rotate_root_addr. Once this operation is complete, the insert state machine 990 transitions to the DONE state 1010.

Finally, in the DONE state 1010, the insert state machine 990 sets the insert_done output to the main module 834 and transitions to the IDLE state 994.

Figure 18A:
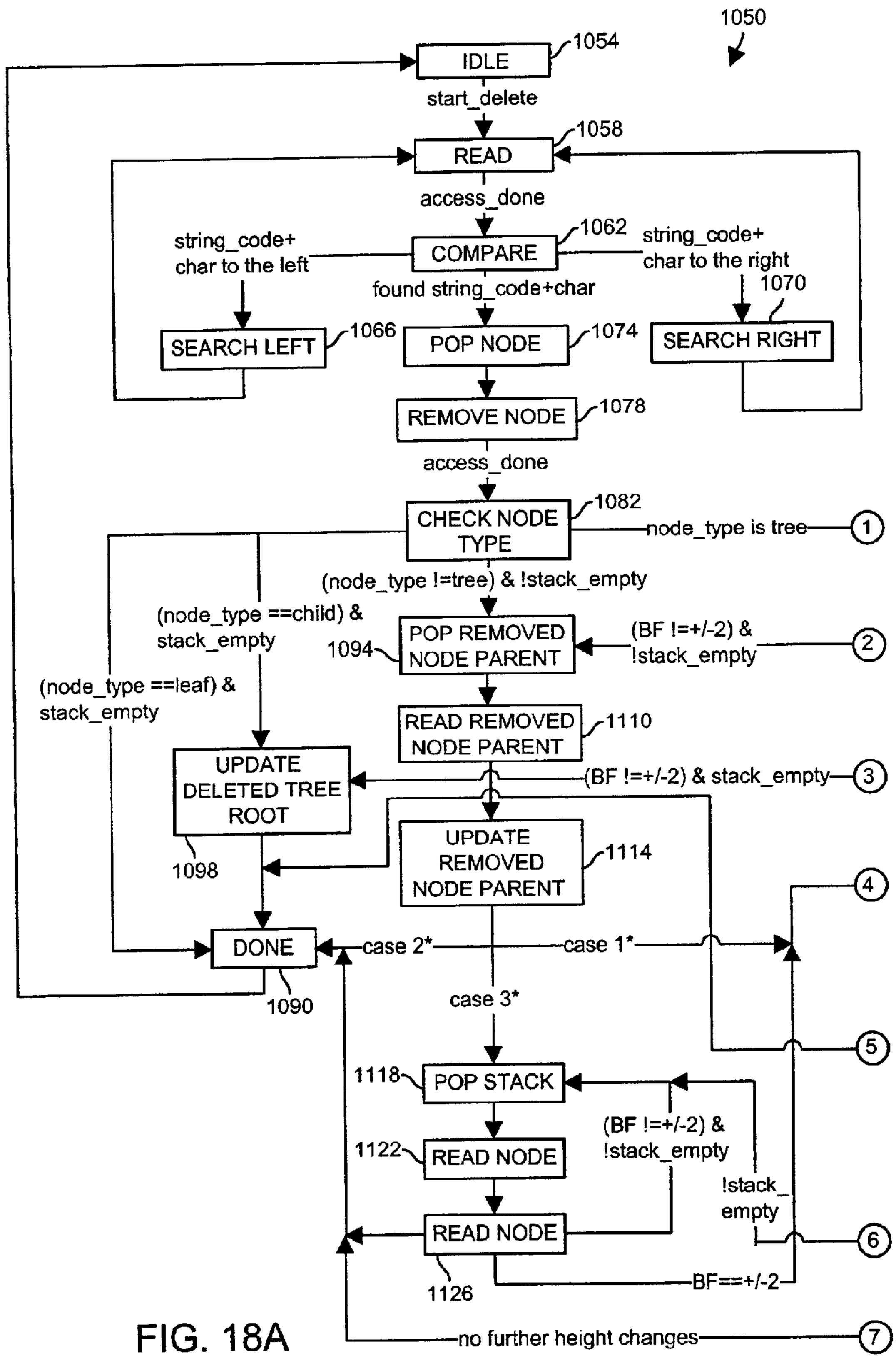
FIG. 18 is an exemplary block diagram representing a state machine of the delete module of FIG. 14.
Figure 18B:
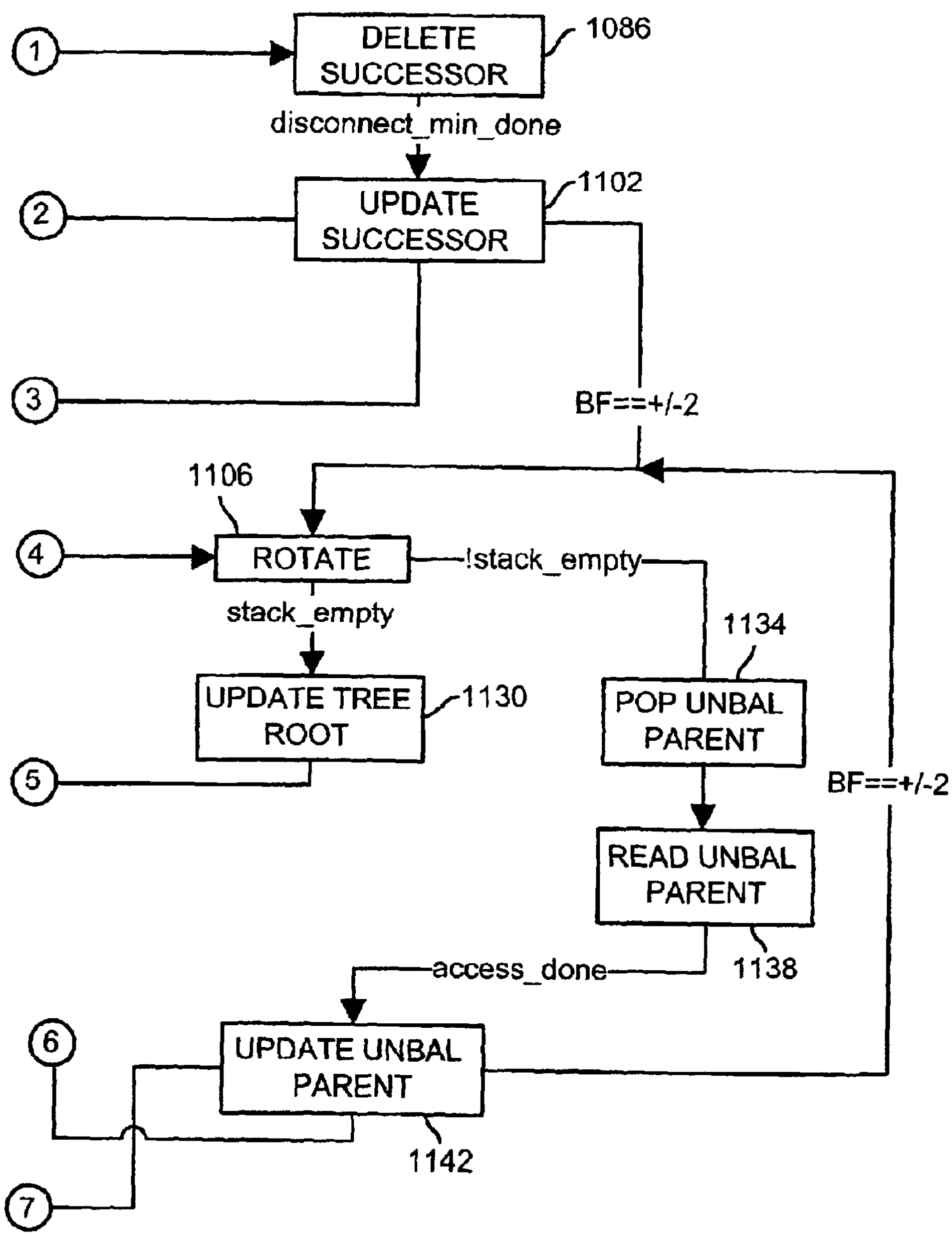

Turning now to FIG. 18, a delete state machine 1050 reveals the details of the delete module 842 of FIG. 14. The delete state machine 1050, and, therefore, the delete module 842, is responsible for removing nodes from the AVL tree. In general, during operation the delete module 842 is provided with a string_code+char to remove from the tree. The delete module 842 begins by searching the AVL tree for string_code+char while storing the nodes in the path to string_code+char in the address stack in a manner similar to the operation of the search module 846 of FIG. 14. Once the desired string is identified and deleted by removing its node from the tree, the tree is rebalanced.

The delete state machine 1050 begins operation in an IDLE state 1054. Once the start_delete signal is asserted, the delete state machine 1050 transitions from the IDLE state 1054 to a READ state 1058. Each of the READ, COMPARE, SEARCH_LEFT and SEARCH_RIGHT states 1058–1070, respectively, operate in substantially the same manners in the delete state machine 1050 as they function in the search state machine 950, which was described in conjunction with FIG. 16.

Once the node representing string_code+char is found, it is denoted as node_to_remove and the delete state machine 1050 transfers execution from the COMPARE state 1058 to a POP_NODE state 1074. In the POP_NODE state 1074, the address stack is popped and the node address for the entry that is to be deleted is stored locally as parent_addr. Parent_addr is initialized to the tree root when the state machine is in the IDLE state 1054 and each time the address stack is popped, the old value of parent_addr is placed in child_addr and parent_addr is set to the value popped from the address stack. This technique is a manner in which a relationship between a parent and its child is maintained. On the next clock cycle, the delete state machine 1050 transitions from the POP_NODE state 1074 to a REMOVE_NODE state 1078.

In the REMOVE_NODE state 1078, the node named node_to_remove is removed by clearing its contents in memory. Also, its node type is stored locally in node_type, which can be either a tree, a branch or a leaf as defined below:

Leaf Node: contains no children

Branch Node: contains only one child

Tree Node: contains both a left and right child.

Once the node removal operation is complete, the delete state machine 1050 transitions to a CHECK_NODE_TYPE state 1082.

In the CHECK_NODE_TYPE state 1082, the delete state machine 1050 evaluates node_type, and takes action based on the node type. If node_type is tree, the delete state machine 1050 transitions to a DELETE_SUCCESSOR state 1086. Alternatively, if node_type is leaf and the address stack is empty, no further height updates are required and the delete state machine 1050 transitions to a DONE state 1090. Further, if node_type is a leaf and the address stack is not empty, further height adjustments are necessary and the delete state machine 1050 transitions to a POP_REMOVED_NODE_PARENT state 1094. If node_type is a branch and the address stack is empty, the tree root must be updated to the removed node's child, so the delete state machine 1050 transitions to an UPDATE_DELETED_TREE_ROOT state 1098. Finally, if node_type is branch and the address stack is not empty, further height adjustments are required and the delete state machine 1050 transitions to the POP_REMOVED_NODE_PARENT state 1094.

In the UPDATE_DELETED_TREE_ROOT state 1098, the tree root is updated to be the codeword of the deleted node's only child. On the next clock cycle, the delete state machine 1050 transitions to the DONE state 1090.

In the DELETE_SUCCESSOR state 1086, the disconnect min module 850 of FIG. 14 is called to delete the smallest element of the right subtree of node_to_remove denoted successor_subtree. The smallest element of successor_subtree will be denoted as successor. The disconnect min module 850 will search successor_subtree and return the codeword for successor, the contents of successor, the address of the new root of successor_subtree, and indicate if the height of the successor_subtree changed due to the removal of successor. Once the disconnect min module 850 indicates that it has completed operation, the delete state machine 1050 transitions to an UPDATE_SUCCESSOR state 1102.

In the UPDATE_SUCCESSOR state 1102, successor is updated by swapping it with node_to_remove as denoted below.

successor→left_child=node_to_remove→left_child successor→right_child=new root of successor_subtree (after removal of successor)

successor→balance_factor=(successor_subtree height change)? node_to_remove→balance_factor−1: node_to_remove→balance_factor All other contents of successor remain the same. A local storage element, named successor_height_change is used to store whether or not the height of the subtree with root successor has changed.

If the height of the successor_subtree did not change, height propagation is complete so successor_height_change is set to zero. If the new balance factor of successor is +/−1, height propagation is complete so successor_height_change is set to zero. If neither of these conditions occurs, successor_height_change is set to one, thereby indicating further height change propagation must continue.

The UPDATE_SUCCESSOR state 1086 then determines the next state to which control must be transferred. If the new balance factor of successor is +/−2, the delete state machine transitions to a ROTATE state 1106. Alternatively, if the address stack is empty, the successor node is the new tree root so the state machine transitions to the UPDATE_DELETED_TREE_ROOT state 1098. If neither of the foregoing criteria are met, control passes from the UPDATE_SUCCESSOR state 1086 to the POP_REMOVED_NODE_PARENT state 1094.

In the POP_REMOVED_NODE_PARENT state 1094, the address stack is popped to obtain the address of the removed node's parent, denoted removed_node_parent. On the next clock cycle the delete state machine 1050 transitions to a READ_REMOVED_NODE_PARENT state 1110. In the state 1110, the contents of removed_node_parent is read from the memory 102 and stored locally. Once the read operation is complete, the delete state machine 1050 transitions to an UPDATE_REMOVED_NODE_PARENT state 1114.

In the UPDATE_REMOVED_NODE_PARENT state 1114, the contents of removed_node_parent are updated depending on node_type, which is the type of node that was deleted. If node_type is leaf or branch and the deletion occurred in the left_child of removed_node_parent, it is updated as follows:

left_child=root of new subtree in which the node was deleted balance_factor=balance_factor+1

All other contents remain unchanged.

Alternatively, if the deletion occurred in the right_child of removed_node_parent, it is updated as follows:

right_child=root of new subtree in which the node was deleted balance_factor=balance_factor−1

Finally, if node_type is tree and the deletion occurred in the left_child of removed_node_parent, it is updated as follows:

left_child=root of new subtree in which the node was deleted balance_factor=(successor_height_change)? balance_factor+1: balance_factor and if the deletion occurred in the right_child, removed_node_parent is updated as follows:

right_child=root of new subtree in which the node was deleted balance_factor=(successor_height_change)? balance_factor−1: balance_factor The next state of the delete state machine 1050 is dependent upon node_type. If node_type is tree, the next state of the delete state machine 1050 will be the ROTATE state 1106, if the new balance factor of removed_node_parent is +/−2. Alternatively, if successor_height_change is zero, meaning height change propagation is complete, the next state of the delete state machine 1050 is the DONE state 1090. The same is true if the address stack is empty or the new balance factor of removed_node_parent is +/−1. If none of these cases occur, the next state of the delete state machine 1050 is a POP_STACK state 1118.

If node_type is not tree, meaning it is leaf or branch, the next state will again be the ROTATE state 1106, if the new balance factor is +/−2. Height change propagation is complete if the new balance factor is +/−1 or the address stack is empty and, therefore, the next state will be the DONE state 1090. Alternatively, the next state will be the POP_STACK state 1118, which continues height change propagation.

In the POP_STACK state 1118, the address stack is popped, and the address is stored locally in parent_addr with the old value of parent_addr stored in child_addr. On the next clock cycle the delete state machine 1050 transitions to a READ_NODE state 1122. In the READ_NODE state 1122, the contents of parent_addr are read from memory 102 and stored locally. Once the read operation is complete the delete state machine 1050 transitions to an UPDATE_NODE state 1126.

In the UPDATE_NODE state 1126, parent_addr is updated to reflect the height change. If the delete was performed in its left subtree, the left_child of parent_addr is set to child_addr and its balance factor is incremented. Alternatively, if the delete was performed in its right subtree, parent_addr's right_child is set to child_addr and its balance factor is decremented. Once the memory 102 is written the delete state machine 1050 transitions to the next state, which is determined based on the value of the balance factor. If the new balance factor is +/−2 or larger, the next state is the ROTATE state 1106 because the tree needs to be balanced. If the new balance factor is +/−1 or the address stack is empty, the next state is the DONE state 1090 because further height change propagation is not necessary. Finally, if neither of these conditions is met, the next state is the POP_STACK state 1118, which causes the delete state machine 1050 to continue height change propagation.

In the ROTATE state 1106, the delete state machine 1050 invokes the rebalance module 858 of FIG. 14 to rotate the subtree whose root has a balance factor of +/−2 or larger. The rebalance module 858 rotates the tree or subtree to fix subtree imbalance. Once the rebalance module 858 has finished the rotation, the delete state machine 1050 transitions to an UPDATE_TREE_ROOT state 1130, if the address stack is empty. Alternatively, if the address stack is not empty, the delete state machine 1050 will transition to a POP_UNBAL_PARENT state 1134.

In the UPDATE_TREE_ROOT state 130, the tree root stored in the main module 834 of FIG. 14 is updated with the root of the rotated tree. On the next clock cycle, the delete state machine 1050 transitions to the DONE state 1090.

In the POP_UNBAL_PARENT state 1134, the address stack is popped, which causes the popped address to be stored in parent_addr and the prior value of parent_addr is stored in child_addr. On the next clock cycle, the delete state machine 1050 transitions to a READ_UNBAL_PARENT state 1138, in which the contents of parent_addr are read from memory 102 and stored locally. Once this operation is complete, the state machine transitions to an UPDATE_UNBAL_PARENT state 1142.

In the UPDATE_UNBAL_PARENT state 1142, the node pointed to by parent_addr, which is the parent of the unbalanced node, is updated. If the deletion occurred in the left subtree, left_child is updated to rotate_root_addr. Otherwise, right_child is updated with rotate_root_addr. The balance factor must be updated as well, if the imbalance was not caused by the special case where a rotation does not cause a height change described in "An Introduction to AVL Trees and Their Implementation," which was written by Brad Appleton and is available at http://www.enteract.com/~bradapp/ftp/src/libs/C++/AvlTrees.html. The balance factor is incremented if the deletion occurred in the left subtree or decremented if the deletion occurred in the right subtree. All other contents of the node remain the same.

If the new balance factor is +/−2 or larger, the next state will be the ROTATE state 1106, which seeks to correct the imbalance. Alternatively, if the new balance factor is +/−1, or the special case where a rotation does not cause further height changes, or the address stack is empty, the next state is the DONE state 1090. If none of these conditions are met, further height changes are required and the next state is the POP_STACK state 1118.

When the delete state machine 1050 is in the DONE state 1090, the delete module 842 outputs a delete_done signal to the main module 834. On the next clock cycle, the delete state machine 1050 transitions to the IDLE state 1054.

Figure 19:
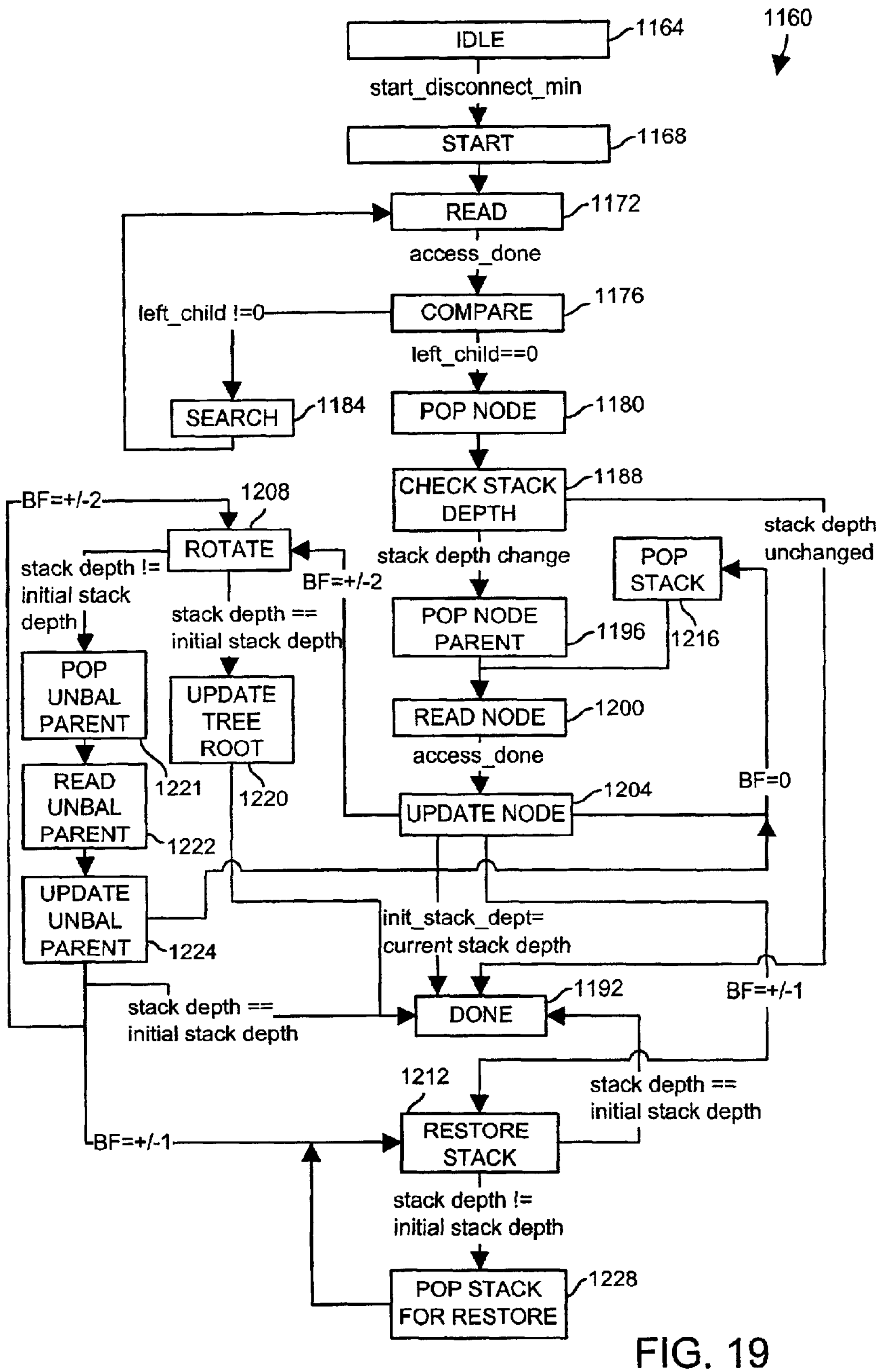
FIG. 19 is an exemplary block diagram representing a state machine of the disconnect min module of FIG. 14.

As shown in FIG. 19, a disconnect min state machine 1160 (hereinafter "the state machine 1160") includes a number of states that collectively implement the disconnect min module 850. In general, the disconnect min module 850 is called by the delete module 842 to remove the smallest element of a subtree. The delete module 842 provides the address of the root of the subtree with which to remove the smallest element.

The state machine 1160 begins operation in an IDLE state 1164 in which parent_addr, which is an 11-bit register is used to store the address for accessing the AVL tree, is initialized to the root of the subtree passed from the delete module 842. Once the start_disconnect_min input is asserted, the state machine 1160 transitions to a START state 1168, in which the address stack depth is saved in the init_stack_depth register. On the next clock cycle, the state machine 1160 transitions to a READ state 1172, in which the node pointed to by parent_addr is read from memory 102 and stored locally. Additionally, the parent_addr is pushed onto the address stack. Once the read operation carried out by the READ state 1172 is complete, the state machine 1160 transitions to a COMPARE state 1176.

In the COMPARE state 1176, the left child is evaluated. If the left child is equal to zero, the smallest element of the subtree is found. This node is denoted successor_node and its contents are stored locally. On the next clock cycle, the state machine transitions to a POP_NODE state 1180. Alternatively, if the foregoing conditions are not met, the state machine 1160 transitions to a SEARCH state 1184.

In the SEARCH state 1184, parent_addr is set to the left child of the node just read from memory 102 to continue the search. On the next clock cycle, the state machine 1160 transitions back to the READ state 1172.

In the POP_NODE state 1180, the address stack is popped and the address is stored in parent_addr. The previous value of parent_addr is stored in child_addr. On the next clock cycle the state machine 1160 transitions to a CHECK_STACK_DEPTH state 1188, in which the current depth of the address stack is compared with init_stack_depth. If the current depth of the address stack is equal to the init_stack_depth, the root of the subtree is the smallest element and, therefore, the state machine 1160 transitions to a DONE state 1192. Alternatively, the state machine 1160 transitions to a POP_NODE_PARENT state 1196.

In the POP_NODE_PARENT state 1196, the address stack is popped and the popped address is stored in parent_addr. Additionally, the right child of successor_node is stored in child_addr. On the next clock cycle, the state machine 1160 transitions to a READ_NODE state 1200, in which the node pointed to by parent_addr is read from memory 102 and its contents are stored locally before parent_addr is pushed onto the address stack. Once the READ_NODE state 1200 has completed operation, the state machine 1160 transitions to an UPDATE_NODE state 1204.

In the UPDATE_NODE state 1204, the node pointed to by parent_addr is updated. Its left child is updated to child_addr and its balance factor is incremented. Once the write operation is complete, the state machine 1160 determines its next state of operation. If the new balance factor is +/−2 or larger, the subtree is imbalanced and the next state is a ROTATE state 1208. Alternatively, if the current address stack depth is equal to init_stack_depth, the current node is the root of the subtree and, therefore, the next state is the DONE state 1192. Alternatively, if the new balance factor is +/−1, further height adjustments are not necessary and the address stack must be restored to the condition that it was in before it was modified by the state machine 1160. Accordingly, control passes to a RESTORE_STACK state 1212. Finally, if none of the foregoing conditions is satisfied, the state machine 1160 transitions to a POP_STACK state 1216 to further propagate height changes.

In the ROTATE state 1208, the state machine 1160 signals the rebalance module 858 of FIG. 14 to rotate the subtree to maintain balance. Once the rebalance module 858 has completed its operation, the state machine 1160 transitions from the ROTATE state 1208 to an UPDATE_TREE_ROOT state 1220, if the current depth of the address stack is equal to init_stack_depth. Alternatively, the state machine 1160 transitions to a POP_UNBAL_PARENT state.

In the UPDATE_TREE_ROOT state 1220, the state machine 1160 stores the new root of the subtree. On the next clock cycle, the state machine 1160 transitions to the DONE state 1192.

In the POP_UNBAL_PARENT state 1221, the state machine 1160 pops the last value from the address stack and stores it in parent_addr. The previous value of parent_addr is stored in child_addr. On the next clock cycle, the state machine 1160 transitions to a READ_UNBAL_PARENT state 1222, in which the node pointed to by parent_addr is read from memory 102 and its contents are stored locally. Once the read operation is complete, the state machine 1160 transitions to UPDATE_UNBAL_PARENT 1224.

In the UPDATE_UNBAL_PARENT state 1224, the parent of the unbalanced node is updated to child/balance factor changes, which is performed in substantially the same manner as it is performed by other modules. Once the write operation completes, the next state is determined. If the new balance factor is +/−2 or larger, the state machine 1160 transitions to the ROTATE state 1208. Alternatively, if the current address stack depth is equal to init_stack_depth, the next state is the DONE state 1192. Further, if the balance factor is +/−1 or the special case of rotation after delete without causing height change propagation occurs, the next state is the RESTORE_STACK state 1212. Finally, if none of the foregoing criteria is satisfied, further height adjustments are necessary and the state machine transitions to the POP_STACK state 1216.

In the RESTORE_STACK state 1212, the current address stack depth is compared to the init_stack_depth. If the two are equal, the stack is restored to its original state and the state machine 1160 transitions to the DONE state 1192. Alternatively, the state machine 1160 transitions to a POP_STACK_FOR_RESTORE state 1228.

In the POP_STACK_FOR_RESTORE state 1228, the last address on the address stack is popped. On the next clock cycle, the state machine 1160 transitions to the RESTORE_STACK state 1212.

In the DONE state 1192, the disconnect min module 850 provides a disconnect_min output signal to the delete module 842, along with the new root of the subtree and successor_node.

Figure 20:
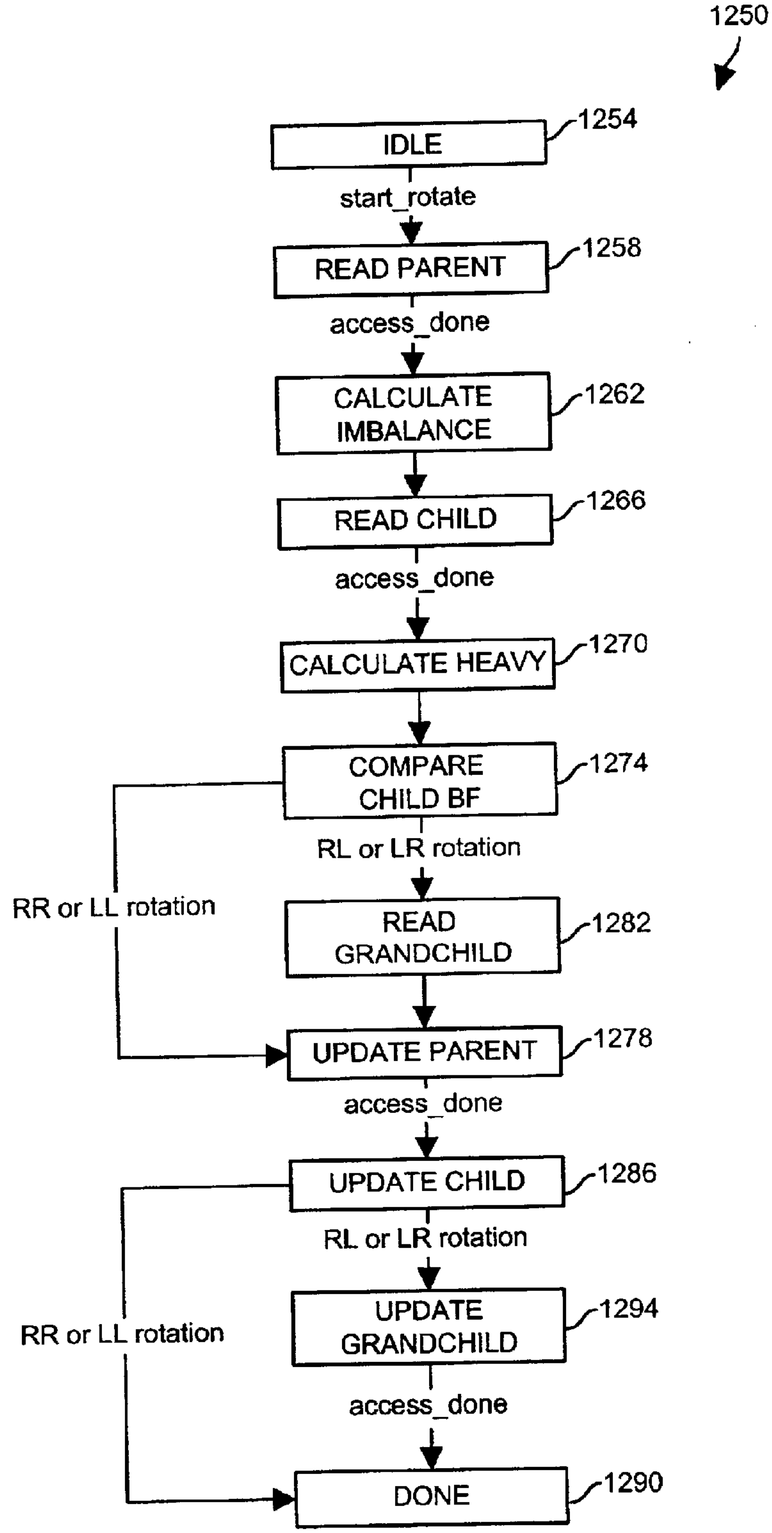
FIG. 20 is an exemplary block diagram representing a state machine of the rebalance module of FIG. 14.

As shown in FIG. 20, the rebalance module 858 of FIG. 14 may be implemented by a rebalance state machine 1250 having a number of different states. The rebalance state machine 1250 is called by the ROTATE states of the insert, delete, and disconnect min modules 838, 842 and 850, respectively, whenever the balance factor of a node is +/−2. In general, the rebalance state machine 1250 receives as input the root of the unbalanced subtree and returns the root of the new balanced subtree.

The state machine 1250 begins execution at an IDLE state 1254. Upon receiving the start_rotate input, the rebalance state machine 1250 transitions to a READ_PARENT state 1258. In the READ_PARENT state 1258, the root of the unbalanced subtree, denoted parent, is read from memory 102 and its contents are stored locally. Once the read operation is complete, the rebalance state machine 1250 transitions to a CALCULATE_IMBALANCE state 1262.

The CALCULATE_IMBALANCE state 1262 determines the direction of the imbalance and stores an indication of the direction of imbalance in a register called imbalance_dir. If the balance factor is −2, there is a left imbalance and 0 is stored in imbalance_dir. If the balance factor is 2, there is a right imbalance and 1 is stored in imbalance_dir. On the next clock cycle, the rebalance state machine 1250 transitions to a READ_CHILD state 1266.

In the READ_CHILD state 1266, the child in the direction of the imbalance of the parent is read from memory 102. For example, if parent has a left imbalance, its left child is read from memory and this node is denoted as child. Once the read operation is complete, the rebalance state machine 1250 transitions to a CALCULATE_HEAVY state 1270.

In the state 1270, the heavy direction of child is calculated and stored in a 2-bit register called heavy_dir. If child's balance factor is −1, the heavy direction is to the left and 0x3 is stored in heavy_dir. Alternatively, if child's balance factor is 1, the heavy direction is to the right and 0x1 is stored in heavy_dir. Finally, if balance factor is zero, the child is balanced and 0x0 is stored in heavy_dir. On the next clock cycle, the rebalance state machine 1250 transitions from the CALCULATE_HEAVY state 1270 to a COMPARE_CHILD_BF state 1274.

In the COMPARE_CHILD_BF state 1274, the type of rotation that needs to be performed is determined as shown in Table 4. If a RR or LL rotation is selected, the next state is an UPDATE_PARENT state 1278. Otherwise, a RL or LR rotations is needed, so the next state is a READ_GRANDCHILD state 1282.

TABLE 4

| Imbalance Direction | Heavy Direction | Rotation Needed |
|---|---|---|
| Left | Left | RR |
| Left | Right | RL |
| Left | Balanced | RR |
| Right | Left | LR |
| Right | Right | LL |
| Right | Balanced | LL |

Further information on how LL, LR, RR and RL rotations may be performed is disclosed in "An Introduction to AVL Trees and Their Implementation," which was written by Brad Appleton and is available at http://www.enteract.com/~bradapp/ftp/src/libs/C++/AvlTrees.html.

In the READ_GRANDCHILD state 1282, the left or right child of child is read from memory 102 and denoted as grandchild. If child is left heavy, the left child is read, otherwise the right child is read. Once the read operation is complete and the contents of grandchild is stored, the rebalance state machine 1250 transitions to the UPDATE_PARENT state 1278.

In the UPDATE_PARENT state 1278, parent's contents are updated depending on the rotations that are performed. Updates are carried out as follows:

1. RR Rotation:
   parent→balance_factor=−(child→balance_factor+1)
   parent→left_child=child→right_child
   parent→right_child=parent→right_child
2. LL Rotation:
   parent→balance_factor=−(child→balance_factor−1)
   parent→left_child=parent→left_child
   parent→right_child=child→left_child
3. RL Rotation:
   parent→balance_factor=−(min(grandchild→balance_factor, 0))
   parent→left_child=grandchild→right_child
   parent→right_child=parent→right_child
4. LR Rotation:
   parent→balance_factor=−(max(grandchild→balance_factor, 0))
   parent→left_child=parent→left_child
   parent→right_child=grandchild→left_child Once the write operation is complete, the rebalance state machine 1250 transitions to an UPDATE_CHILD state 1286. In the UPDATE_CHILD state 1286, the child is updated based on rotations as follows:

1. RR Rotation:
   child→balance_factor=child→balance_factor+1
   child→left_child=child→left_child
   child→right_child=parent
2. LL Rotation:
   child→balance_factor=child→balance_factor−1 child→left_child=parent child→right_child=child→right_child

3. RL Rotation:

child→balance_factor=neg(max(grandchild→balance_factor, 0))

child→left_child=child→left_child child→right_child=grandchild→left_child

4. LR Rotation:

child→balance_factor=neg(min(grandchild→balance_factor, 0))

child→left_child=grandchild→right_child child→right_child=child→right_child

The rebalance module 858 provides the address of the root of the new subtree, denoted new_root_addr as outputs. If either a RR or LL rotation is performed, child is stored in new_root_addr because the rotation is complete and child is now the root of the new subtree. Once the update operation is complete, the rebalance state machine 1250 transitions to a DONE state 1290 if an RR or LL rotation is required. Alternatively, the next state of the rebalance state machine 1250 is an UPDATE_GRANDCHILD state 1294.

In the UPDATE_GRANDCHILD state 1294, grandchild is updated, depending on rotation type, as follows:

1. RL Rotation:

grandchild→balance_factor=0 grandchild→left_child=child grandchild→right_child=parent

2. LR Rotation:

grandchild→balance_factor=0 grandchild→left_child=parent grandchild→right_child=child

After the rotations are complete, grandchild is stored in new_root_addr and grandchild is the root of the new subtree. Once grandchild is updated, the rebalance state machine 1250 transitions to the DONE state 1290. In the DONE state 1290, the rebalance state machine 1250 signals to the main module 834 that the rotate operation is complete by asserting the rotate_done output.

Figure 21:
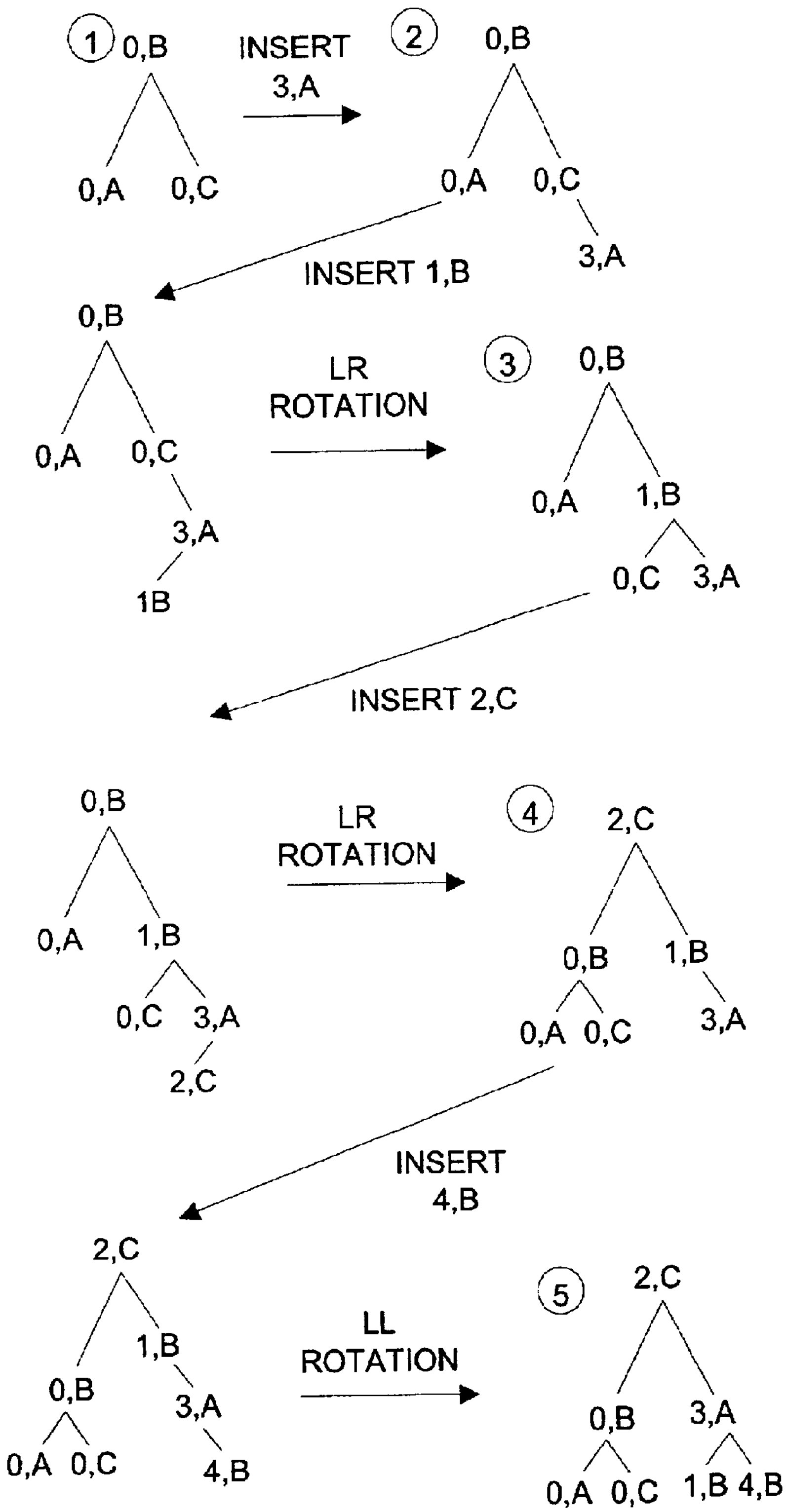
FIG. 21 is an exemplary representation of how the encoder and decoder dictionaries are updated when strings are transmitted.

Turning now to FIG. 21, five different states of a dictionary, which may be either or both of the encoder and decoder dictionaries, are shown as represented by the encircled Arabic numerals. FIG. 21 is described hereinafter in conjunction with Table 5 below to describe the various states of a dictionary as the string CABCAB is sent. For simplicity sake, the following description presupposes the use of an alphabet including only the letters A, B and C. As will be readily understood, other implementations of the dictionary may include any or all ASCII characters and the implementation of such a dictionary would follow directly from the simplified example provided herein. Where appropriate, the following description includes references to the state machines previously described.

As shown below, Table 5 includes a number of rows, each of which represents a codeword (cw). Additionally, Table 5 includes rows designating prev_code, attach_char, balance factor, left child, right child and reference count, which are represented as pc, ac, bf, lc, rc and ref, respectively. The encircled Arabic numerals of Table 5 correspond to the various dictionary states shown in FIG. 21. As used hereinafter the term key means the concatenation of prev_code and attach_char. The key, balance factor, left child, right child and reference count are all stored in a memory, as shown in Table 5.

TABLE 5

| | ① | ② | ③ | ④ | ⑤ |
|---|---|---|---|---|---|
| cw | pc,ac,bf,lc,rc,ref | pc,ac,bf,lc,rc,ref | pc,ac,bf,lc,rc,ref | pc,ac,bf,lc,rc,ref | pc,ac,bf,lc,rc,ref |
| 1 | 0,A,0,0,0,0 | 0,A,0,0,0,0 | 0,A,0,0,0,0 | 0,A,0,0,0,0 | 0,A,0,0,0,0 |
| 2 | 0,B,0,1,3,0 | 0,B,1,1,3,0 | 0,B,1,1,5,0 | 0,B,0,1,3,0 | 0,B,0,1,3,0 |
| 3 | 0,C,0,0,0,0 | 0,C,1,0,4,0 | 0,C,0,0,0,0 | 0,C,0,0,0,0 | 0,C,0,0,0,0 |
| 4 | | 3,A,0,0,0,0 | 3,A,0,0,0,0 | 3,A,0,0,0,0 | 3,A,0,5,7,1 |
| 5 | | | 1,B,0,3,4,0 | 1,B,1,0,4,0 | 1,B,0,0,0,0 |
| 6 | | | | 2,C,0,2,5,0 | 2,C,0,2,4,0 |
| 7 | | | | | 4,B,0,0,0,0 |

As shown in state 1of Table 5 and FIG. 21, the dictionary tree is initialized, or seeded, with all of the letters of the alphabet (i.e., in this example, A, B and C). The keys of each of A, B and C are 0,A; 0,B and 0,C because seed entries in the dictionary do not have any previous codeword values. As shown in FIG. 21 and reflected in Table 5 , key 0,B is the root node of the tree, with 0,A and 0,C forming the left and right children, respectively. Accordingly, the lc and rc entries for codeword 2, which corresponds to B, are 1 and 3, respectively. This represents that codeword 1 is the left child of codeword 2 and codeword 3 is the right child of codeword 2. The dictionary tree may be filled by an encoder that receives strings and encodes the strings into codewords. Alternatively, the dictionary tree may be filled by an encoder that receives codewords and decodes the codewords into strings. Both of the encoding and decoding processes are described below.

When the string CABCAB is received by the encoder, the dictionary is searched for C, which is found at codeword 3. Searching may be carried out by the state machine 950 of FIG. 16. After C is found at codeword 3, prev_code is set to 3 and the dictionary is searched for 3,A, which is the prev_code and the second letter of the string. Because 3,A is not found in the dictionary, codeword 3, which represents the first C of the string, is transmitted and 3,A is inserted into the dictionary at the next available codeword, which, in this case, is codeword 4. Insertion may be carried out by, for example, the state machine 990. After 3,A is inserted into the dictionary, the dictionary has the structure shown at state 2, which is represented by the encircled Arabic numeral 2 in Table 5 and on FIG. 21. As shown in FIG. 21, 3,A is inserted as the right child of 0,C, which is represented in Table 5 by the codeword 4 being place in the rc field of codeword 3.

After 3,A is inserted into the dictionary, the codeword for A, which is 1, is designated as the prev_code and the next character of the string, which is B, is read. After the character B is read, the dictionary is searched for 1,B, an entry that is not in the dictionary. Because 1,B is not found in the dictionary, the codeword 1, which represents the A of the string, is transmitted and 1,B is added to the dictionary at the next available codeword, which, in this case, is codeword 5. Additionally, the codeword 2, which is the codeword for B, is designated as prev_code. As shown in FIG. 21, the addition of 1,B to the node 3,A creates an imbalance in the directory tree. The imbalance is corrected by the state machine 1250, which performs a left-right rotation on the dictionary. The results of the left-right rotation are shown as state 3 in both Table 5 and FIG. 21.

After 1,B is inserted into the dictionary and the dictionary is rotated so that it is balanced, the next character of the string, which is C, and the dictionary is searched for 2,C. Because 2,C is not in the dictionary, it is added at the next available codeword, which is codeword 6. Additionally, the codeword 2 is transmitted and prev_code is set to codeword 3, which represents C. Because the insertion of 2,C imbalances the dictionary, the state machine 1250 performs a left-right rotation on the dictionary to result in the dictionary structure shown in Table 5 and FIG. 21 at encircled Arabic numeral 4.

After 2,C has been inserted into the dictionary, and the dictionary has been rebalanced, the next character of the string, which is A is read and the dictionary is searched for 3,A. Because 3,A is found in the dictionary, prev_code is set to the codeword 4, which is the codeword for 3,A.

After prev_code is set to 4, the next character of the string, which is a B is read. Accordingly, the dictionary is searched for 4,B, which is not in the dictionary. Because 4,B is not found in the dictionary, codeword 4, which is the codeword for 3,A, is transmitted. It will be readily appreciated that 3,A, in turn, represents C,A. Accordingly, by transmitting a codeword of 4, the characters C,A are transmitted. After the codeword 4 is transmitted, prev_code is set to 2 and 4,B is inserted into the dictionary.

The insertion of 4,B into the dictionary creates a dictionary imbalance and the state machine 1250 performs a left-left rotation on the dictionary structure to result in the structure shown in the encircled Arabic numeral 5 in Table 5 and in FIG. 21. Additionally, as shown in codeword 4 of Table 5, the ref of codeword 4 is changed from a zero to a one at state 5. A ref of 1 indicates that codeword 4 is referenced by one other codeword (in this case codeword 7) and, therefore, codeword 4 cannot be deleted. It should be noted that even though the ref numbers of the seeds (i.e., the dictionary entries corresponding to codewords of 3 or less) is zero, such codewords will never be deleted because seeds of a dictionary are never deleted.

In the foregoing description, codewords are referred to as having been transmitted. When transmitted codewords are received, a decoder recovers the character or character string that the codeword represent. For example, with reference to Table 5 and FIG. 21, if a decoder receives the codeword 3, the decoder knows the character corresponding to codeword 3 is a C. By way of further example, if a decoder receives the codeword 7, such a codeword is decoded into the codeword 4 and the character B. The codeword 4 is, in turn, decoded into the codeword 3 and the character A. Further, the codeword 3 is then decoded into the character C. By assembling the characters the string CAB can be recovered from the codeword 7. As will be readily appreciated, if each codeword is 11 bits long and if each character is 8 bits in length, sending one codeword, as opposed to three characters, is a compression ratio of 24:11—over two to one. The longer the string of characters, the potentially larger the compression ratio may be when sets of those characters are sent using codewords.

When a decoder receives the codewords 3,1,2,4,2, which were sent by the encoder to represent CABCAB, the codewords are processed as follows to build a codeword dictionary within the decoder. The codeword dictionary within the decoder is formed in the same states as shown in Table 5 at the encircled Arabic numerals.

In particular, at state 1, when the receiver receives the codeword 3, the decoder processes the codeword 3 to determine that codeword 3 represents the character C. At this point, the prev_code is 0 and the attach_char is C. The decoder searches the dictionary for 0,C, which it finds at codeword 3 and, therefore prev_code is set to 3.

After prev_code is set to 3, the decoder receives and decodes the codeword 1, which is decoded into the character A. At this point, prev_code is set to 3 and attach_char is set to A. The decoder then searches for 3,A, which is not found in the dictionary. At the Arabic numeral 2 of Table 5, 3,A is inserted into the dictionary as codeword 4. After 3,A is inserted into the dictionary as codeword 4, prev_code is set to 1.

After setting prev_code to 1, the decoder receives codeword 2, which the decoder decodes into the character B. After codeword 2 is decoded into the character B, prev_code is set to 1 and attach_char is set to B. Accordingly, the dictionary is searched for 1,B, which is not present in the dictionary. Because 1,B is not in the dictionary, it is added thereto at codeword 5, as shown at Arabic numeral 3 in Table 5.

After 1,B is inserted into the dictionary, prev_code is set to 2, which is the codeword for B, and the decoder receives the codeword 4. The decoder decodes the codeword 4 into the characters CA and sets prev_code to 2 and attach_char to C before searching the dictionary for 2,C. Because the dictionary does not contain 2,C, 2,C is added thereto at codeword 6, as shown at the Arabic numeral 4 in Table 5. Subsequently, prev_code is set to 4, which is the codeword for CA.

The decoder then receives the codeword 2, which it decodes into character B. At this point prev_code is set to 4 and attach_char is set to B. The dictionary is then searched for 4,B, which is not found in the dictionary. Accordingly, at shown at the Arabic numeral 5 in Table 5, 4,B is added to the dictionary at codeword 7.

As will be readily appreciated, the events described in conjunction with FIG. 21 and Table 5 are exemplary and can be carried out for any suitable alphabet and any suitable text string. Accordingly, the foregoing example should be regarded as merely exemplary and not as limiting.

Numerous modifications and alternative embodiments of the invention will be apparent to those skilled in the art in view of the foregoing description. Accordingly, this description is to be construed as illustrative only and not as limiting to the scope of the invention. The details of the structure may be varied substantially without departing from the spirit of the invention, and the exclusive use of all modifications, which are within the scope of the appended claims, is reserved.

What is claimed is:

1. An encoding system adapted to encode data strings into codewords, the encoding system comprising:

- a first memory portion adapted to store a dictionary of data strings and codewords corresponding to the data strings, wherein the dictionary is implemented as a balanced binary tree;
- a second memory portion adapted to store a data string to be processed; and
- an encoder adapted to receive from the second memory portion the data string to be processed, to determine if a codeword corresponding to a portion of the data string to be processed is stored in the dictionary and to output a codeword corresponding to a data string previously found in the dictionary if the codeword corresponding to the portion of the data string to be processed is not stored in the dictionary, wherein the encoder is further adapted to balance the dictionary.

2. The encoding system of claim 1, wherein the first and second memory portions comprise portions of a single memory.

3. The encoding system of claim 1, further comprising a buffer adapted to receive a variable length input and to outputs a fixed length output.

4. The encoding system of claim 1, wherein the encoder is adapted to balance the dictionary using an Adelson-Velskii and Landis (AVL) algorithm.

5. The encoding system of claim 1, wherein the dictionary is organized according to keys formed from a codeword corresponding to a set of characters of the data string to be processed and from an additional character of the data string to be processed.

6. The encoding system of claim 5, wherein the set of characters is received by the encoder before the additional character is received by the encoder.

7. The encoding system of claim 5, wherein the set of characters comprises a single character.

8. The encoding system of claim 5, wherein the set of characters comprises a plurality of characters.

9. The encoding system of claim 1, wherein the encoder is adapted to add a codeword to the dictionary if the codeword corresponding to the portion of the data string to be processed is not stored in the dictionary.

10. The encoding system of claim 1, wherein the encoder is adapted to delete codewords from the dictionary.

11. The encoding system of claim 1, wherein the encoder is adapted to balance the dictionary by rotating the dictionary.

12. The encoding system of claim 11, wherein rotating the dictionary comprises making right-right rotations.

13. The encoding system of claim 11, wherein rotating the dictionary comprises making left-left rotations.

14. The encoding system of claim 11, wherein rotating the dictionary comprises making right-left rotations.

15. The encoding system of claim 11, wherein rotating the dictionary comprises making left-right rotations.

16. The encoding system of claim 1, wherein the encoder comprises a plurality of state machines.

17. The encoding system of claim 1, wherein the encoder is adapted to determine if the dictionary is unbalanced.

18. The encoding system of claim 17, wherein the encoder is adapted to balance the dictionary if the dictionary is unbalanced.

19. A decoding system adapted to decode codewords into data strings, the decoding system comprising:

a memory adapted to store a dictionary of data strings and codewords corresponding to the data strings, wherein the dictionary is implemented as a balanced binary tree;

an input buffer adapted to receive and store a set of codewords to be processed; and a decoder adapted to receive from the input buffer the set of codewords to be processed, to decode a first codeword into a first character string, to decode a second codeword into a second character string and to assign a third codeword to a combination of the first codeword and the second character string if a codeword corresponding to the combination of the first codeword and the second character string is not stored in the dictionary, wherein the decoder is further adapted to balance the dictionary.

20. The decoding system of claim 19, wherein the input buffer comprises a first-in, first-out buffer adapted to receive a fixed length input and to output a variable length output.

21. The decoding system of claim 19, wherein the decoder is adapted to balance the dictionary using an Adelson-Velskii and Landis (AVL) algorithm.

22. The decoding system of claim 19, wherein the dictionary is organized according to keys formed from the first codeword and the second character string.

23. The decoding system of claim 22, wherein the first codeword is received by the decoder before the second codeword is received by the decoder.

24. The decoding system of claim 22, wherein the first character string comprises a single character.

25. The decoding system of claim 22, wherein the first character string comprises a plurality of characters.

26. The decoding system of claim 19, wherein the decoder is adapted to delete codewords from the dictionary.

27. The decoding system of claim 19, wherein the decoder is adapted to balance the dictionary by rotating the dictionary.

28. The decoding system of claim 27, wherein rotating the dictionary comprises making right-right rotations.

29. The decoding system of claim 27, wherein rotating the dictionary comprises making left-left rotations.

30. The decoding system of claim 27, wherein rotating the dictionary comprises making right-left rotations.

31. The decoding system of claim 27, wherein rotating the dictionary comprises making left-right rotations.

32. The decoding system of claim 19, wherein the decoder comprises a plurality of state machines.

33. The decoding system of claim 19, wherein the decoder is adapted to determine if the dictionary is unbalanced.

34. The decoding system of claim 33, wherein the decoder is adapted to balance the dictionary if the dictionary is unbalanced.

35. An encoder adapted to operate with a first memory portion adapted to store a dictionary of data strings and codewords corresponding to the data strings, wherein the dictionary is implemented as a balanced binary tree, and a second memory portion adapted to receive and store a data string to be processed, the encoder comprising:

a first hardware state machine adapted to receive from the second memory portion the data string to be processed;

a second hardware state machine adapted to determine if a codeword corresponding to a portion of the data string to be processed is stored in the dictionary and to output a codeword corresponding to a data string previously found in the dictionary if the codeword corresponding to the portion of the data string to be processed is not stored in the dictionary; and a third hardware state machine adapted to balance the dictionary.

36. The encoder of claim 35, wherein the first and second memory portions comprise portions of a single memory.

37. The encoder of claim 35, wherein the third hardware state machine is adapted to balance the dictionary using an Adelson-Velskii and Landis (AVL) algorithm implemented in hardware.

38. The encoder of claim 37, wherein the dictionary is organized according to keys formed from a codeword corresponding to a set of characters of the data string to be processed and from an additional character of the data string to be processed.

39. The encoder of claim 38, wherein the set of characters is received by the first hardware state machine before the additional character is received by the first hardware state machine.

40. The encoder of claim 38, wherein the set of characters comprises a single character.

41. The encoder of claim 38, wherein the set of characters comprises a plurality of characters.

42. The encoder of claim 35, wherein the second hardware state machine is adapted to add a codeword to the dictionary if the codeword corresponding to the portion of the data string to be processed is not stored in the dictionary.

43. The encoder of claim 35, wherein the second hardware state machine is adapted to delete codewords from the dictionary.

44. The encoder of claim 35, wherein the third hardware state machine is adapted to balance the dictionary by rotating the dictionary.

45. The encoder of claim 35, wherein the third hardware state machine is adapted to determine if the dictionary is unbalanced.

46. The encoder of claim 45, wherein the third hardware state machine is adapted to balance the dictionary if the dictionary is unbalanced.

47. A decoder adapted to operate with a memory adapted to store a dictionary of data strings and codewords corresponding to the data strings, wherein the dictionary is implemented as a balanced binary tree, and an input buffer adapted to receive and store a set of codewords to be processed, the decoder comprising:

- a first hardware state machine adapted to receive from the input buffer the set of codewords to be processed;
- a second hardware state machine adapted to decode a first codeword into a first character string, to decode a second codeword into a second character string and to assign a third codeword to a combination of the first codeword and the second character string if a codeword corresponding to the combination of the first codeword and the second character string is not stored in the dictionary; and
- a third hardware state machine adapted to balance the dictionary.

48. The decoder of claim 47, wherein the third hardware state machine is adapted to balance the dictionary using an Adelson-Velskii and Landis (AVL) algorithm implemented in hardware.

49. The decoder of claim 47, wherein the dictionary is organized according to keys formed from the first codeword and the second character string.

50. The decoder of claim 49, wherein the first codeword is received by the first hardware state machine before the second codeword is received by the first hardware state machine.

51. The decoder of claim 49, wherein the first character string comprises a single character.

52. The decoder of claim 49, wherein the first character string comprises a plurality of characters.

53. The decoder of claim 47, wherein the second hardware state machine is adapted to delete codewords from the dictionary.

54. The decoder of claim 47, wherein the second hardware state machine is adapted to balance the dictionary by rotating the dictionary.

55. The decoder of claim 47, wherein the third hardware state machine is adapted to determine if the dictionary is unbalanced.

56. The decoder of claim 55, wherein the third hardware state machine is adapted to balance the dictionary if the dictionary is unbalanced.

* * * * *